US008672516B2

(12) United States Patent
Chowdhury et al.

(10) Patent No.: US 8,672,516 B2
(45) Date of Patent: Mar. 18, 2014

(54) LIGHTWEIGHT HEAT SINKS AND LED LAMPS EMPLOYING SAME

(75) Inventors: Ashfaqul I. Chowdhury, Broadview Heights, OH (US); Gary R. Allen, Chesterland, OH (US)

(73) Assignee: GE Lighting Solutions, LLC, Cleveland, OH (US)

( * ) Notice: Subject to any disclaimer, the term of this patent is extended or adjusted under 35 U.S.C. 154(b) by 590 days.

(21) Appl. No.: 12/979,573

(22) Filed: Dec. 28, 2010

(65) Prior Publication Data

US 2012/0080699 A1 Apr. 5, 2012

Related U.S. Application Data

(60) Provisional application No. 61/388,104, filed on Sep. 30, 2010.

(51) Int. Cl.
*F28F 7/00* (2006.01)
*H01L 33/64* (2010.01)

(52) U.S. Cl.
USPC .............................. 362/294; 165/185; 257/98

(58) Field of Classification Search
USPC .................................... 362/294, 373, 249.02
See application file for complete search history.

(56) References Cited

U.S. PATENT DOCUMENTS

| | | | | |
|---|---|---|---|---|
| 5,660,461 | A * | 8/1997 | Ignatius et al. | 362/241 |
| 7,055,987 | B2 * | 6/2006 | Staufert | 362/235 |
| 7,196,459 | B2 * | 3/2007 | Morris | 313/46 |
| 8,297,797 | B2 * | 10/2012 | Kim et al. | 362/294 |
| 2007/0159828 | A1 | 7/2007 | Wang | |
| 2009/0103293 | A1 | 4/2009 | Harbers et al. | |
| 2010/0072506 | A1 * | 3/2010 | Bae et al. | 257/99 |

FOREIGN PATENT DOCUMENTS

| | | |
|---|---|---|
| EP | 0 751 339 | 1/1997 |
| EP | 1 467 144 A2 | 10/2004 |
| EP | 1 662 197 A2 | 5/2006 |
| WO | WO 03/021623 | 3/2003 |
| WO | WO 2009/071111 | 6/2009 |

* cited by examiner

*Primary Examiner* — Anabel Ton
(74) *Attorney, Agent, or Firm* — Fay Sharpe LLP

(57) ABSTRACT

A heat sink comprises a heat sink body, a reflective layer disposed over the heat sink body that has reflectivity greater than 90% for light in the visible spectrum, and a light transmissive protective layer disposed over the reflective layer that is light transmissive for light in the visible spectrum. The heat sink body may comprise a structural heat sink body and a thermally conductive layer disposed over the structural heat sink body where the thermally conductive layer has higher thermal conductivity than the structural heat sink body and the reflective layer is disposed over the thermally conductive layer. A light emitting diode (LED)-based lamp comprises the aforesaid heat sink and an LED module secured with and in thermal communication with the heat sink. The LED-based lamp may have an A-line bulb configuration, or may comprise a directional lamp in which the heat sink defines a hollow light-collecting reflector.

28 Claims, 22 Drawing Sheets

Light Weight Low Cost Heat Sink with Effective Conductivity 100-200+ W/m-K

| | |
|---|---|
| LED Par 38 Heat Sink Area | 932.2 cm2 |
| LED Par 38 Heat Sink Volume | 104.05 cm3 |
| Copper Thickness | 300 microns |
| | 0.03 cm |
| Copper Density | 8.9 gm/cm3 |
| Aluminum Density | 2.6 gm/cm3 |
| Polypropylene Density | 0.92 gm/cm3 |
| Copper Cost | 7.50 $/kg |
| Aluminum Cost | 2.54 $/kg |
| Polypropylene Cost | 1.20 $/kg |

| Heat Sink Material Choice | Heat Sink Weight, gm | Heat Sink Material Cost, $ |
|---|---|---|
| Aluminum | 271 | 0.69 |
| Cu clad PP | 124 | 0.32 |
| **Reduction, %** | 54% | 53% |

Fig. 15

LIGHTWEIGHT HEAT SINKS AND LED LAMPS EMPLOYING SAME

This application claims the benefit of U.S. Provisional Application No. 61/388,104 filed Sep. 30, 2010. U.S. Provisional Application No. 61/388,104 filed Sep. 30, 2010 is incorporated herein by reference in its entirety.

BACKGROUND

The following relates to the illumination arts, lighting arts, solid state lighting arts, thermal management arts, and related arts.

Conventional incandescent, halogen, and high intensity discharge (HID) light sources have relatively high operating temperatures, and as a consequence heat egress is dominated by radiative and convective heat transfer pathways. For example, radiative heat egress goes with temperature raised to the fourth power, so that the radiative heat transfer pathway becomes superlinearly more dominant as operating temperature increases. Accordingly, thermal management for incandescent, halogen, and HID light sources typically amounts to providing adequate air space proximate to the lamp for efficient radiative and convective heat transfer. Typically, in these types of light sources, it is not necessary to increase or modify the surface area of the lamp to enhance the radiative or convective heat transfer in order to achieve the desired operating temperature of the lamp.

Light-emitting diode (LED)-based lamps, on the other hand, typically operate at substantially lower temperatures for device performance and reliability reasons. For example, the junction temperature for a typical LED device should be below 200° C., and in some LED devices should be below 100° C. or even lower. At these low operating temperatures, the radiative heat transfer pathway to the ambient is weak compared with that of conventional light sources, so that convective and conductive heat transfer to ambient typically dominate over radiation. In LED light sources, the convective and radiative heat transfer from the outside surface area of the lamp or luminaire can both be enhanced by the addition of a heat sink.

A heat sink is a component providing a large surface for radiating and convecting heat away from the LED devices. In a typical design, the heat sink is a relatively massive metal element having a large engineered surface area, for example by having fins or other heat dissipating structures on its outer surface. The large mass of the heat sink efficiently conducts heat from the LED devices to the heat fins, and the large area of the heat fins provides efficient heat egress by radiation and convection. For high power LED-based lamps it is also known to employ active cooling using fans or synthetic jets or heat pipes or thermo-electric coolers or pumped coolant fluid to enhance the heat removal.

BRIEF SUMMARY

In some embodiments disclosed herein as illustrative examples, a heat sink comprises: a heat sink body; a reflective layer disposed over the heat sink body that has reflectivity greater than 90% for light in the visible spectrum; and a light transmissive protective layer disposed over the reflective layer that is light transmissive for light in the visible spectrum. In some embodiments the heat sink body comprises a structural heat sink body and a thermally conductive layer disposed over the structural heat sink body, the thermally conductive layer having higher thermal conductivity than the structural heat sink body, the reflective layer being disposed over the thermally conductive layer.

In some embodiments disclosed herein as illustrative examples, a heat sink comprises: a heat sink body; a specularly reflective layer disposed over the heat sink body; and a light transmissive protective layer disposed over the specularly reflective layer, the light transmissive protective layer selected from a group consisting of: a silicon dioxide ($SiO_2$) layer; a silica layer; a plastic layer; and a polymeric layer. In some embodiments the heat sink body is a plastic or polymeric heat sink body, which optionally includes a copper layer disposed over the plastic or polymeric heat sink body with the specularly reflective layer being disposed over the copper layer.

In some embodiments disclosed herein as illustrative examples, a light emitting diode (LED)-based lamp comprises a heat sink as set forth in any of the two immediately preceding paragraphs and an LED module secured with and in thermal communication with the heat sink. The LED-based lamp may have an A-line bulb configuration and further include a diffuser illuminated by the LED module and the heat sink may include fins disposed inside or outside the diffuser with the reflective layer and the light transmissive protective layer being disposed over at least the fins. The LED-based lamp may comprise a directional lamp in which the heat sink defines a hollow light-collecting reflector and in which the reflective layer and the light transmissive protective layer are disposed over at least an inner surface of the hollow light collecting reflector. In some such directional lamps, the heat sink may include inwardly extending fins disposed inside the hollow light collecting reflector with the reflective layer and the light transmissive protective layer additionally being disposed over at least the inwardly extending fins.

In some embodiments disclosed herein as illustrative examples, a light emitting diode (LED)-based lamp comprises a hollow diffuser, an LED module arranged to illuminate inside the hollow diffuser, and a heat sink including a plurality of fins wherein at least some of the fins are disposed inside the hollow diffuser.

In some embodiments disclosed herein as illustrative examples, a directional lamp comprises a heat sink comprising a hollow light collecting reflector having a relatively smaller entrance aperture and a relatively larger exit aperture and a light emitting diode (LED) module optically coupled into the entrance aperture, wherein the heat sink further includes a plurality of fins extending inwardly from an inner surface of the hollow light collecting reflector.

BRIEF DESCRIPTION OF THE DRAWINGS

FIG. 15 shows calculations for weight and material cost of a PAR-38 heat sink fabricated as disclosed herein using copper plating of a plastic heat sink body, as compared with a bulk aluminum heat sink of equal size and shape.

DETAILED DESCRIPTION

In the case of incandescent, halogen, and HID light sources, all of which are thermal emitters of light, the heat transfer to the air space proximate to the lamp is managed by design of the radiative and convective thermal paths in order to achieve an elevated target temperature during operation of the light source. In contrast, in the case of LED light sources, photons are not thermally-excited, but rather are generated by recombination of electrons with holes at the p-n junction of a semiconductor. Both the performance and the life of the light source are optimized by minimizing the operating temperature of the p-n junction of the LED, rather than operating at an elevated target temperature. By providing a heat sink with fins or other surface area-increasing structures, the surface for convective and radiative heat transfer is enhanced.

Figure 1:
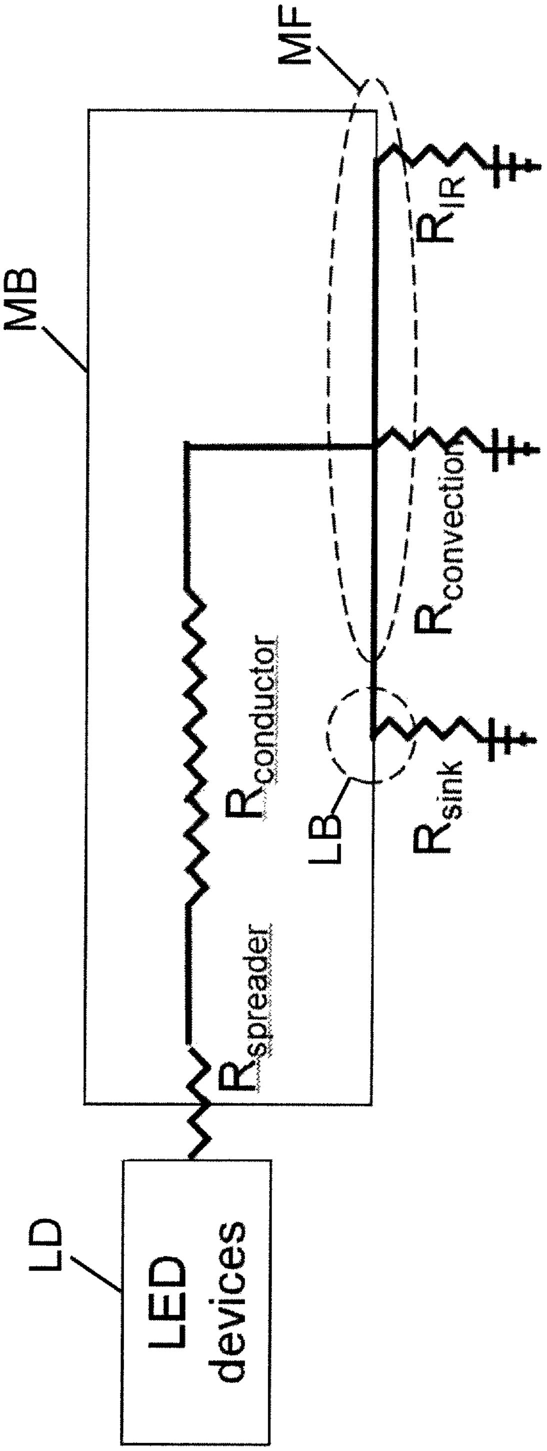
FIGS. 1 and 2 diagrammatically show thermal models for a conventional heat sink employing a metal heat sink component (FIG. 1) and for a heat sink as disclosed herein (FIG. 2).

With reference to FIG. 1, a metal heat sink MB with fins is diagrammatically indicated by a block, and the fins MF of the heat sink are diagrammatically indicated by a dashed oval. The surface through which heat is transferred into the surrounding ambient by convection and/or radiation is referred to herein as the heat sinking surface (e.g., the fins MF), and should be of large area to provide sufficient heat sinking for LED devices LD in steady state operation. Convective and radiative heat sinking into the ambient from the heat sinking surface MF can be modeled in steady state by thermal resistances $R_{convection}$ and $R_{IR}$, respectively or, equivalently, by thermal conductances. The resistance $R_{convection}$ models convection from the outside surface of the heat sink to the proximate ambient by natural or forced air flow. The resistance $R_{IR}$ models infrared (IR) radiation from the outside surface of the heat sink to the remote ambient. Additionally, a thermal conduction path (denoted in FIG. 1 by the resistances $R_{spreader}$ and $R_{conductor}$) is in series between the LED devices LD and the heat sinking surface MF, which represents thermal conduction from the LED devices LD to the heat sinking surface MF. A high thermal conductance for this series thermal conduction path ensures that heat egress from the LED devices to the proximate air via the heat sinking surface is not limited by the series thermal conductance. This is typically achieved by constructing the heat sink MB as a relatively massive block of metal having a finned or otherwise enhanced surface area MF defining the heat sinking surface—the metal heat sink body provides the desired high thermal conductance between the LED devices and the heat sinking surface. In this design, the heat sinking surface is inherently in continuous and intimate thermal contact with the metal heat sink body that provides the high thermal conductance path.

Thus, conventional heat sinking for LED-based lamps includes the heat sink MB comprising a block of metal (or metallic alloy) having the large-area heat sinking surface MF exposed to the proximate air space. The metal heat sink body provides a high thermal conductance pathway $R_{conductor}$ between the LED devices and the heat sinking surface. The resistance $R_{conductor}$ in FIG. 1 models conduction through the metal heat sink body MB. The LED devices are mounted on a metal-core circuit board or other support including a heat spreader, and heat from the LED devices conducts through the heat spreader to the heat sink. This is modeled by the resistance $R_{spreader}$.

In addition to heat sinking into the ambient via the heat sinking surface (resistances $R_{convection}$ and $R_{IR}$), there is typically also some thermal egress (i.e., heat sinking) through the Edison base or other lamp connector or lamp base LB (diagrammatically indicated in the model of FIG. 1 by a dashed circle). This thermal egress through the lamp base LB is represented in the diagrammatic model of FIG. 1 by the resistance $R_{sink}$, which represents conduction through a solid or a heat pipe to the remote ambient or to the building infrastructure. However, it is recognized herein that in the common case of an Edison-type base, the thermal conductance and temperature limits of the base LB will limit the heat flux through the base to about 1 watt. In contrast, for LED-based lamps intended to provide illumination for interior spaces such as rooms, or for outdoor lighting, the heat output to be sinked is typically about 10 watts or higher. Thus, it is recognized herein that the lamp base LB cannot provide the primary heat sinking pathway. Rather, heat egress from the LED devices LD is predominantly via conduction through the metal heat sink body to the outer heat sinking surface of the heat sink where the heat is sinked into the surrounding ambient by convection ($R_{convection}$) and (to a lesser extent) radiation ($R_{IR}$). The heat sinking surface may be finned (e.g., fins MF in diagrammatic FIG. 1) or otherwise modified to enhance its surface area and hence increase the heat sinking.

Such heat sinks have some disadvantages. For example, the heat sinks are heavy due to the large volume of metal or metal alloy comprising the heat sink MB. A heavy metal heat sink can put mechanical stress on the base and socket which can result in failure and, in some failure modes, an electrical hazard. Another issue with such heat sinks is manufacturing cost. Machining, casting, or molding a bulk metal heat sink component can be expensive, and depending on the choice of metal the material cost can also be high. Moreover, the heat sink is sometimes also used as a housing for electronics, or as a mounting point for the Edison base, or as a support for the LED devices circuit board. These applications call for the heat sink to be machined, cast, or molded with some precision, which again increases manufacturing cost.

The inventors have analyzed these problems using the simplified thermal model shown in FIG. 1. The thermal model of FIG. 1 can be expressed algebraically as a series-parallel circuit of thermal impedances. In the steady state, all transient impedances, such as the thermal mass of the lamp itself, or the thermal masses of objects in the proximate ambient, such as lamp connectors, wiring, and structural mounts, may be treated as thermal capacitances. The transient impedances (i.e., thermal capacitances) may be ignored in steady state, just as electrical capacitances are ignored in DC electrical circuits, and only the resistances need be considered. The total thermal resistance $R_{thermal}$ between the LED devices and the ambient may be written as $$R_{thermal} = R_{spreader} + R_{conduction} + \left(\frac{1}{R_{sink}} + \frac{1}{R_{convention}} + \frac{1}{R_{IR}}\right)^{-1}$$

where: $R_{sink}$ is the thermal resistance of heat passing through the Edison connector (or other lamp connector) to the "ambient" electrical wiring; $R_{convection}$ is the thermal resistance of heat passing from the heat sinking surface into the surrounding ambient by convective heat transfer; $R_{IR}$ is the thermal resistance of heat passing from the heat sinking surface into the surrounding ambient by radiative heat transfer; and $R_{spreader}+R_{conduction}$ is the series thermal resistance of heat passing from the LED devices through the heat spreader ($R_{spreader}$) and through the metal heat sink body ($R_{conduction}$) to reach the heat sinking surface. It should be noted that for the term $1/R_{sink}$, the corresponding series thermal resistance is not precisely $R_{spreader}+R_{conduction}$ since the series thermal pathway is to the lamp connector rather than to the heat sinking surface—however, since the thermal conductance $1/R_{sink}$ through the base connector is small for a typical lamp this error is negligible. Indeed, a simplified model neglecting heat sinking through the base entirely can be written as $$R_{thermal} = R_{spreader} + R_{conduction} + \left(\frac{1}{R_{convection}} + \frac{1}{R_{IR}}\right)^{-1}.$$

This simplified equation demonstrates that the series thermal resistance $R_{conduction}$ through the heat sink body is a controlling parameter of the thermal model. Indeed, this is a justification for the conventional heat sink design employing the bulk metal heat sink MB—the heat sink body provides a very low value for the series thermal resistance $R_{conduction}$. In view of the foregoing, it is recognized that it would be desirable to achieve a heat sink that has a low series thermal resistance $R_{conduction}$, while simultaneously having reduced weight (and, preferably, reduced cost) as compared with a conventional heat sink.

One way this might be accomplished is to enhance thermal heat sinking $R_{sink}$ through the base, so that this pathway can be enhanced to provide a heat sinking rate of 10 watts or higher. However, in retrofit light source applications in which an LED lamp is used to replace a conventional incandescent or halogen or fluorescent or HID lamp, the LED replacement lamp is mounted into a conventional base or socket or luminaire of the type originally designed for an incandescent, halogen, or HID lamp. For such a connection, the thermal resistance $R_{sink}$ to the building infrastructure or to the remote ambient (e.g. earth ground) is large compared with $R_{convection}$ or $R_{IR}$ so that the thermal path to ambient by convection and radiation dominates.

Additionally, due to the relatively low steady state operating temperature of the LED assembly, the radiation path is typically dominated by the convection path (that is, $R_{convection} \ll R_{IR}$), although in some cases they are comparable. Therefore, the dominant thermal path for a typical LED-based lamp is the series thermal circuit comprising $R_{conduction}$ and $R_{convection}$. It is therefore desired to provide a low series thermal resistance $R_{conduction}+R_{convection}$, while reducing the weight (and, preferably, cost) of the heat sink.

The present inventors have carefully considered from a first-principles viewpoint the problem of heat removal in an LED-based lamp. It is recognized herein that, of the parameters typically considered of significance (heat sink volume and mass, heat sink thermal conductance, heat sink surface area, and conductive heat removal and sinking through the base), the two dominant design attributes are the thermal conductance of the pathway between the LEDs and the heat sink (that is, $R_{conduction}$), and the outside surface area of the heat sink for convective and radiative heat transfer to the ambient (which affects $R_{convection}$ and $R_{IR}$).

Further analysis can proceed by a process of elimination. The heat sink volume is of importance only insofar as it affects heat sink thermal conductance and heat sink surface area. The heat sink mass is of importance in transient situations, but does not strongly affect steady-state heat removal performance, which is what is of interest in a continuously operating lamp, except to the extent that the metal heat sink body provides a low series resistance $R_{conduction}$. The heat sinking path through the base of a replacement lamp, such as a PAR or MR or reflector or A-line lamp, can be of significance for lower power lamps—however, the thermal conductance of an Edison base is only sufficient to provide about 1 watt of heat sinking to the ambient (and other base types such as pin-type bases are likely to have comparable or even less thermal conductance), and hence conductive heat sinking through the base to ambient is not expected to be of principle importance for commercially viable LED-based lamps which are expected to generate heating loads up to several orders of magnitude higher at steady state.

Figure 2:
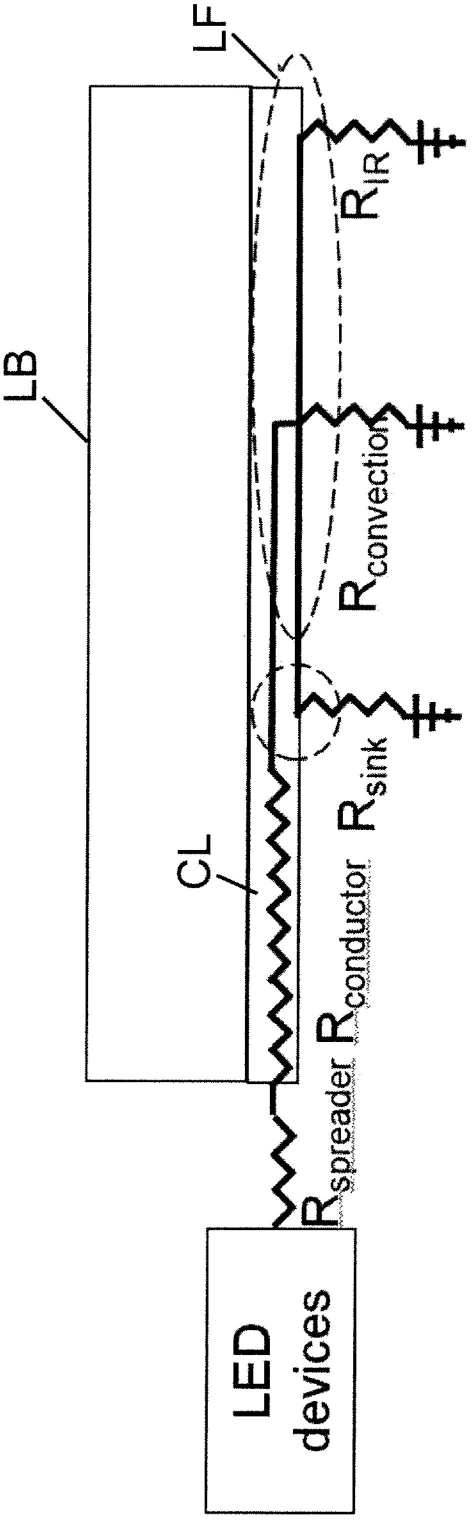

With reference to FIG. 2, based on the foregoing an improved heat sink is disclosed herein, comprising a lightweight heat sink body LB, which is not necessarily thermally conductive, and a thermally conductive layer CL disposed over the heat sink body to define the heat sinking surface. The heat sink body is not part of the thermal circuit (or, optionally, may be a minor component via some thermal conductivity of the heat sink body)—however, the heat sink body LB defines the shape of the thermally conductive layer CL that defines the heat sinking surface. For example, the heat sink body LB may have fins LF that are coated by the thermally conductive layer CL. Because the heat sink body LB is not part of the thermal circuit (as shown in FIG. 2), it can be designed for manufacturability and properties such as structural soundness and low weight. In some embodiments the heat sinking body LB is a molded plastic component comprising a plastic that is thermally insulating or has relatively low thermal conductivity.

The thermally conductive layer CL disposed over the lightweight heat sink body LB performs the functionality of the heat sinking surface, and its performance with respect to heat sinking into the surrounding ambient (quantified by the thermal resistances $R_{convection}$ and $R_{IR}$) is substantially the same as in the conventional heat sink modeled in FIG. 1. Additionally, however, the thermally conductive layer CL defines the thermal pathway from the LED devices to the heat sinking surface (quantified by the series resistance $R_{conduction}$). This also is diagrammatically shown in FIG. 2. To achieve a sufficiently low value for $R_{conduction}$, the thermally conductive layer CL should have a sufficiently large thickness (since $R_{conduction}$ decreases with increasing thickness) and should have a sufficiently high material thermal conductivity (since $R_{conduction}$ also decreases with increasing material thermal conductivity). It is disclosed herein that by suitable selection of the material and thickness of the thermally conductive layer CL, a heat sink comprising a lightweight (and possibly thermally insulating) heat sink body LB and a thermally conductive layer CL disposed over the heat sink body and defining the heat sinking surface can have heat sinking performance comparable, to or better than, an equivalently sized and shaped heat sink of bulk metal, while simultaneously being substantially lighter, and cheaper to manufacture, than the equivalent heat sink of bulk metal. Again, it is not merely the surface area available for radiative/convective heat sinking to ambient that is determinative of the performance of the heat sink, but also the thermal conductance of heat across the outer surface defined by the heat sinking layer (that is, corresponding to the series resistance $R_{conduction}$) that is in thermal communication with the ambient. Higher surface conductance promotes more efficient distribution of the heat over the total heat sinking surface area and hence promotes the radiative and convective heat sinking to ambient.

In view of the foregoing, heat sink embodiments are disclosed herein which comprise a heat sink body and a thermally conductive layer disposed on the heat sink body at least over (and defining) the heat sinking surface of the heat sink. The material of the heat sink body has a lower thermal conductivity than the material of the thermally conductive layer. Indeed, the heat sink body can even be thermally insulating. On the other hand, the thermally conductive layer should have (i) an area and (ii) a thickness and (iii) be made of a material of sufficient thermal conductivity so that it provides radiative/convective heat sinking to the ambient that is sufficient to keep the p-n semiconductor junctions of the LED devices of the LED-based lamp at or below a specified maximum temperature, which is typically below 200° C. and sometimes below 100° C.

The thickness and material thermal conductivity of the thermally conductive layer together define a thermal sheet conductivity of the thermally conductive layer, which is analogous to an electrical sheet conductivity (or, in the inverse, an electrical sheet resistance). A thermal sheet resistance $$R_s = \frac{\rho}{d} = (\sigma \cdot d)^{-1}$$

may be defined, where ρ is the thermal resistivity of the material and σ is the thermal conductivity of the material, and d is the thickness of the thermally conductive layer. Inverting yields the thermal sheet conductance $K_s=\sigma \cdot d$. Thus, a trade-off can be made between the thickness d and the material thermal conductivity σ of the thermally conductive layer. For high thermal conductivity materials, the thermally conductive layer can be made thin, which results in reduced weight, volume, and cost.

In embodiments disclosed herein, the thermally conductive layer comprises a metallic layer, such as copper, aluminum, various alloys thereof, or so forth, that is deposited by electroplating, vacuum evaporation, sputtering, physical vapor deposition (PVD), plasma-enhanced chemical vapor deposition (PECVD), or another suitable layer-forming technique operable at a sufficiently low temperature to be thermally compatible with plastic or other material of the heat sink body. In some illustrative embodiments, the thermally conductive layer is a copper layer that is formed by a sequence including electroless plating followed by electroplating. In other embodiments, the thermally conductive layer comprises a nonmetallic thermally conductive layer such as boron nitride (BN), a carbon nanotubes (CNT) layer, a thermally conductive oxide, or so forth.

The heat sink body (that is, the heat sink not including the thermally conductive layer) does not strongly impact the heat removal, except insofar as it defines the shape of the thermally conductive layer that performs the heat spreading (quantified by the series resistance $R_{conduction}$ in the thermal model of FIG. 2) and defines the heat sinking surface (quantified by the resistances $R_{convection}$ and $R_{IR}$ in the thermal model of FIG. 2). The surface area provided by the heat sink body affects the subsequent heat removal via radiation and convection. As a result, the heat sink body can be chosen to achieve desired characteristics such as low weight, low cost, structural rigidity or robustness, thermal robustness (e.g., the heat sink body should withstand the operating temperatures without melting or unduly softening), ease of manufacturing, maximal surface area (which in turn controls the surface area of the thermally conductive layer), and so forth. In some illustrative embodiments disclosed herein the heat sink body is a molded plastic element, for example made of a polymeric material such as poly(methyl methacrylate), nylon, polyethylene, epoxy resin, polyisoprene, sbs rubber, polydicyclopentadiene, polytetrafluoroethulene, poly(phenylene sulfide), poly(phenylene oxide), silicone, polyketone, thermoplastics, or so forth. The heat sink body can be molded to have fins or other heat radiation/convection/surface area enhancing structures.

To minimize cost, the heat sink body is preferably formed using a one-shot molding process and hence has a uniform material consistency and is uniform throughout (as opposed, for example, to a heat sink body formed by multiple molding operations employing different molding materials such that the heat sink body has a nonuniform material consistency and is not uniform throughout), and preferably comprises a low-cost material. Toward the latter objective, the material of the heat sink body preferably does not include any metal filler material, and more preferably does not include any electrically conductive filler material, and even more preferably does not include any filler material at all. However, it is also contemplated to include a metal filler or other filler, such as dispersed metallic particles to provide some thermal conductivity enhancement or nonmetallic filler particles to provide enhanced mechanical properties.

In the following, some illustrative embodiments are described.

Figure 4:
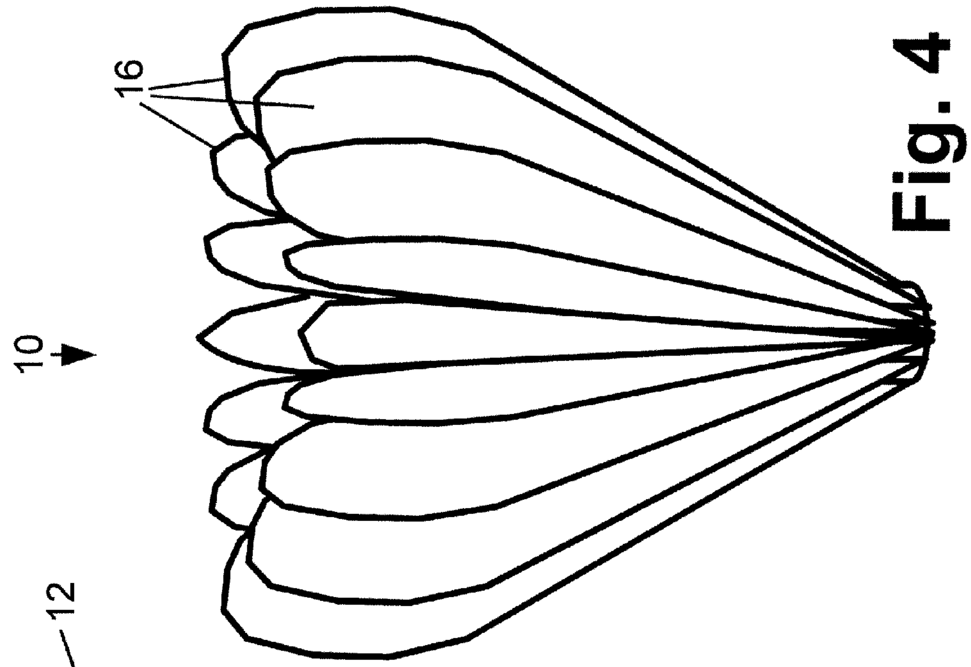
FIGS. 3 and 4 diagrammatically show side sectional and side perspective views, respectively, of a heat sink suitably used in an MR or PAR lamp.
Figure 3:
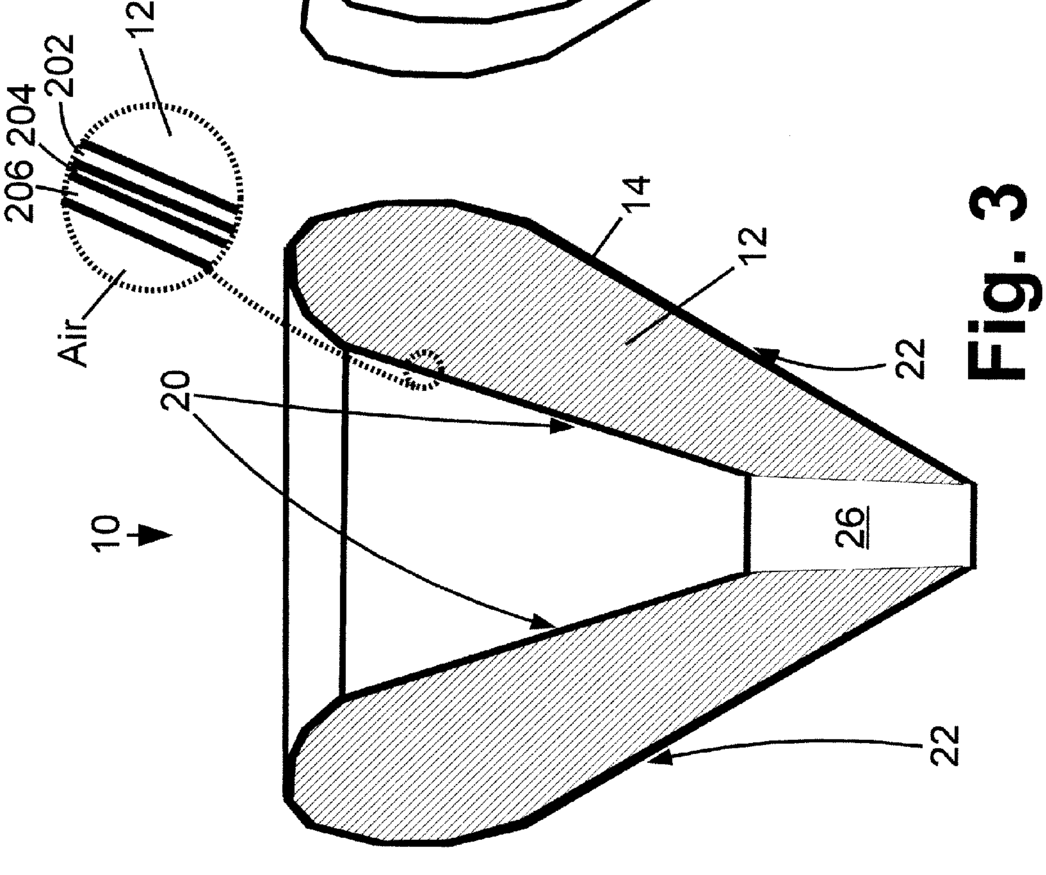

With reference to FIGS. 3 and 4, a heat sink 10 has a configuration suitable for use in an MR or PAR type LED-based lamp. The heat sink 10 includes a heat sink body 12 made of plastic or another suitable material as already described, and a thermally conductive layer 14 disposed on the heat sink body 12. The thermally conductive layer 14 may be a metallic layer such as a copper layer, an aluminum layer, or various alloys thereof. In illustrative embodiments, the thermally conductive layer 14 comprises a copper layer formed by electroless plating followed by electroplating.

As best seen in FIG. 4, the heat sink 10 has fins 16 to enhance the ultimate radiative and convective heat removal. Instead of the illustrated fins 16, other surface area enhancing structures could be used, such as multi-segmented fins, rods, micro/nano scale surface and volume features or so forth. The illustrative heat sink body 12 defines the heat sink 10 as a hollow generally conical heat sink having inner surfaces 20 and an outer surfaces 22. In the embodiment shown in FIG. 3, the thermally conductive layer 14 is disposed on both the inner surfaces 20 and the outer surfaces 22. Alternatively, the thermally conductive layer may be disposed on only the outer surfaces 22, as shown in the alternative embodiment heat sink 10' of FIG. 7.

Figure 6:
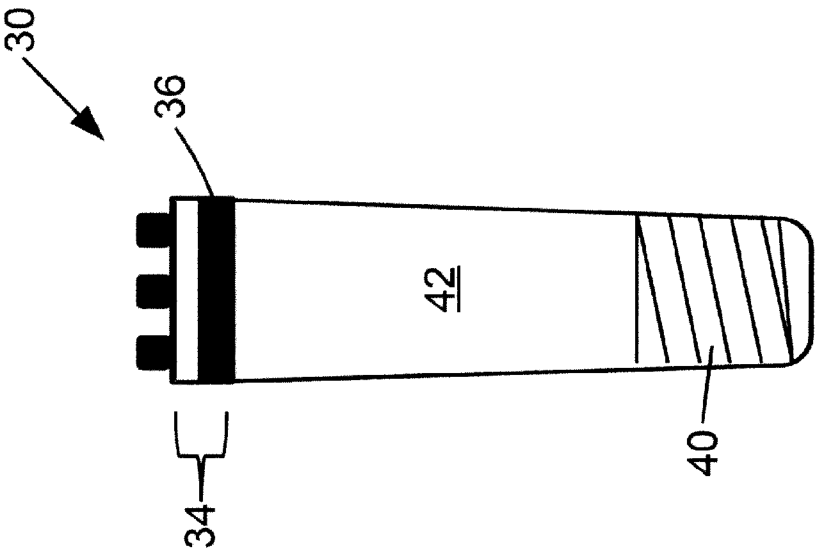
FIG. 6 diagrammatically shows a side view of the optical/electronic module of the MR or PAR lamp of FIG. 5.
Figure 5:
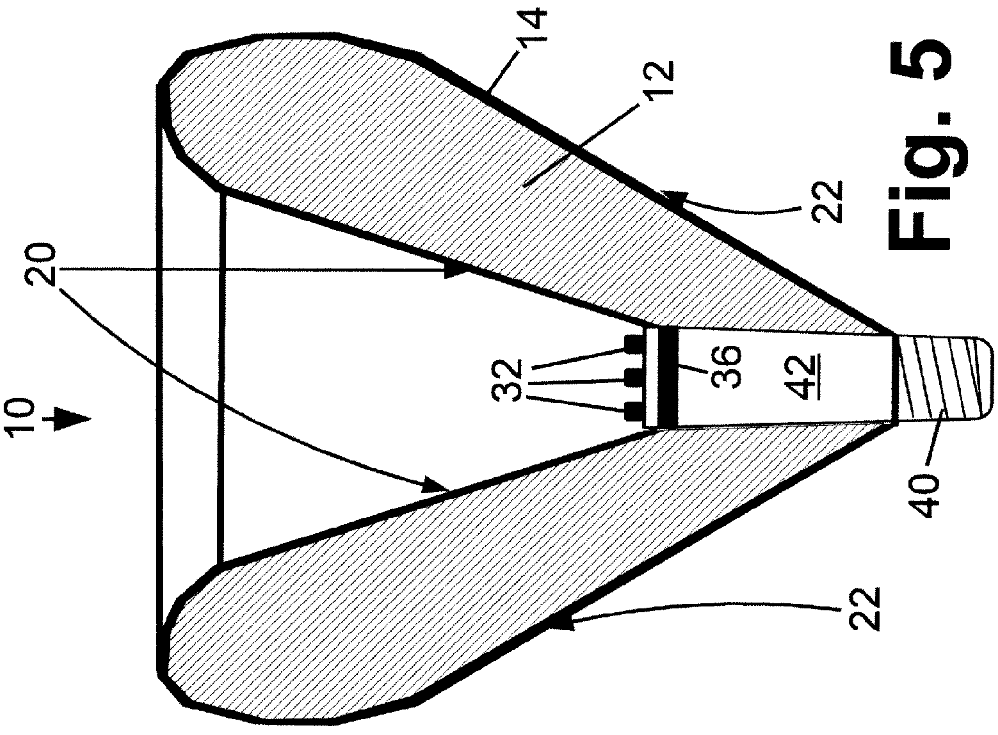
FIG. 5 diagrammatically shows a side sectional view of an MR or PAR lamp including the heat sink of FIGS. 3 and 4.

With continuing reference to FIGS. 3 and 4 and with further reference to FIGS. 5 and 6, the illustrative hollow generally conical heat sink 10 includes a hollow vertex 26. An LED module 30 (shown in FIG. 6) is suitably disposed at the vertex 26, as shown in FIG. 5) so as to define an MR- or PAR-based lamp. The LED module 30 includes one or more (and in the illustrative example three) light-emitting diode (LED) devices 32 mounted on a metal core printed circuit board (MCPCB) 34 in thermal communication with a heat spreader 36, that may alternatively comprise a metal layer of the MCPCB 34. The illustrative LED module 30 further includes a threaded Edison base 40; however, other types of bases, such as a bayonet pin-type base, or a pig tail electrical connector, can be substituted for the illustrative Edison base 40. The illustrative LED module 30 further includes electronics 42. The electronics may comprise an enclosed electronics unit 42 as shown, or may be electronic components disposed in the hollow vertex 26 of the heat sink 10 without a separate housing. The electronics 42 suitably comprise power supply circuitry for converting the A.C. electrical power (e.g., 110 volts U.S. residential, 220 volts U.S. industrial or European, or so forth) to (typically lower) DC voltage suitable for operating the LED devices 32. The electronics 42 may optionally include other components, such as electrostatic discharge (ESD) protection circuitry, a fuse or other safety circuitry, dimming circuitry, or so forth.

As used herein, the term "LED device" is to be understood to encompass bare semiconductor chips of inorganic or organic LEDs, encapsulated semiconductor chips of inorganic or organic LEDs, LED chip "packages" in which the LED chip is mounted on one or more intermediate elements such as a sub-mount, a lead-frame, a surface mount support, or so forth, semiconductor chips of inorganic or organic LEDs that include a wavelength-converting phosphor coating with or without an encapsulant (for example, an ultra-violet or violet or blue LED chip coated with a yellow, white, amber, green, orange, red, or other phosphor designed to cooperatively produce white light), multi-chip inorganic or organic LED devices (for example, a white LED device including three LED chips emitting red, green, and blue, and possibly other colors of light, respectively, so as to collectively generate white light), or so forth. The one or more LED devices 32 may be configured to collectively emit a white light beam, a yellowish light beam, red light beam, or a light beam of substantially any other color of interest for a given lighting application. It is also contemplated for the one or more LED devices 32 to include LED devices emitting light of different colors, and for the electronics 42 to include suitable circuitry for independently operating LED devices of different colors to provide an adjustable color output.

The heat spreader 36 provides thermal communication from the LED devices 32 to the thermally conductive layer 14. Good thermal coupling between the heat spreader 36 and the thermally conductive layer 14 may be achieved in various ways, such as by soldering, thermally conductive adhesive, a tight mechanical fit optionally aided by high thermal conductivity pad between the LED module 30 and the vertex 26 of the heat sink 10, or so forth. Although not illustrated, it is contemplated to have the thermally conductive layer 14 be also disposed over the inner diameter surface of the vertex 26 to provide or enhance the thermal coupling between the heat spreader 36 and the thermally conductive layer 14.

Figure 7:
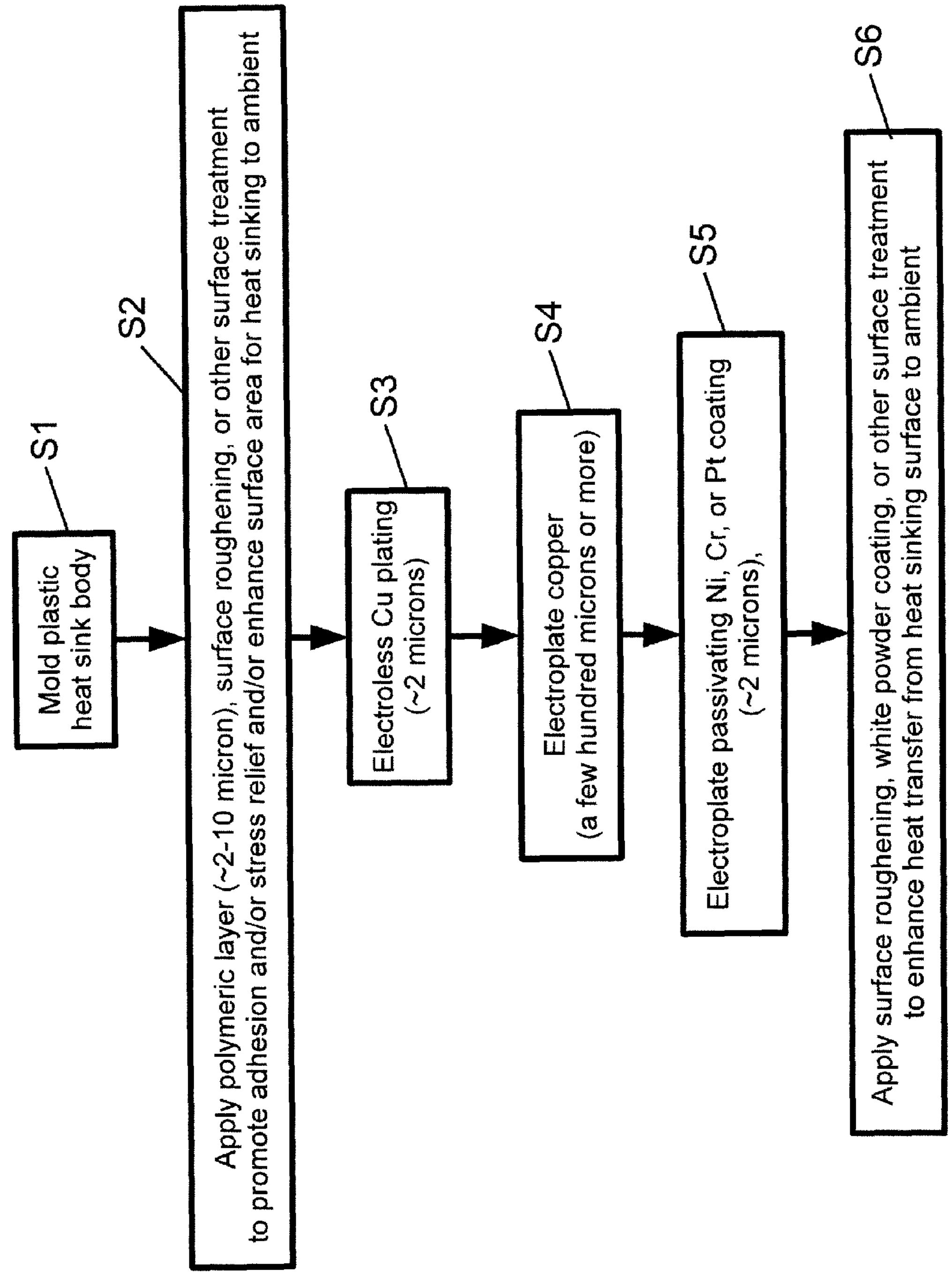
FIG. 7 diagrammatically flow charts a suitable manufacturing process for manufacturing a lightweight heat sink.

With reference to FIG. 7, a suitable manufacturing approach is set forth. In this approach the heat sink body 12 is first formed in an operation S1 by a suitable method such as by molding, which is convenient for forming the heat sink body 12 in embodiments in which the heat sink body 12 comprises a plastic or other polymeric material. Other approaches for forming the heat sink body 12 include casting, extruding (in the case of a cylindrical heat sink, for example), or so forth. In an optional operation S2, the surface of the molded heat sink body is processed by applying a polymeric layer (typically around 2-10 micron, although larger or smaller thicknesses are also contemplated), performing surface roughening, or by applying other surface treatment. The optional surface processing operation(s) S2 can perform various functions such as promoting adhesion of the subsequently plated copper, providing stress relief, and/or enhancing surface area for heat sinking to ambient. On the latter point, by roughening or pitting the surface of the plastic heat sink body, the subsequently applied copper coating will follow the roughening or pitting so as to provide a larger heat sinking surface.

In an operation S3 an initial layer of copper is applied by electroless plating. The electroless plating advantageously can be performed on an electrically insulating (e.g., plastic) heat sink body. However, electroless plating has a slow deposition rate. Design considerations set forth herein, especially providing a sufficiently low series thermal resistance $R_{conduction}$, motivate toward employing a plated copper layer whose thickness is of order a few hundred microns. Accordingly, the electroless plating is used to deposit an initial copper layer (preferably having a thickness of no more than 50 microns, in some embodiments less than ten microns, and in some embodiments having a thickness of about 2 microns or less) so that the plastic heat sink body with this initial copper layer is electrically conductive. The initial electroless plating S3 is then followed by an electroplating operation S4 which rapidly deposits the balance of the copper layer thickness, e.g. typically a few hundred microns. The electroplating S4 has a much higher deposition rate as compared with electroless plating S3.

One issue with a copper coating is that it can tarnish, which can have adverse impact on the heat sinking thermal transfer from the surface into the ambient, and also can be aesthetically displeasing. Accordingly, in an optional operation S5 a suitable passivating layer is optionally deposited on the copper, for example by electroplating a passivating metal such as nickel, chromium, or platinum, or a passivating metal oxide, on the copper. The passivating layer, if provided, typically has a thickness of less than 50 microns, in some embodiments no more than ten microns, and in some embodiments has a thickness of about two microns or less. An optional operation(s) S6 can also be performed, to provide various surface enhancements such as surface roughening, applying an optically thick powder coating such as a metal oxide powder (e.g., titanium dioxide powder, aluminum oxide powder, or a mixture thereof, or so forth), an optically thick paint or lacquer or varnish or so forth. These surface treatments are intended to enhance heat transfer from the heat sinking surface to the ambient via enhanced convection and/or radiation.

Figure 8:
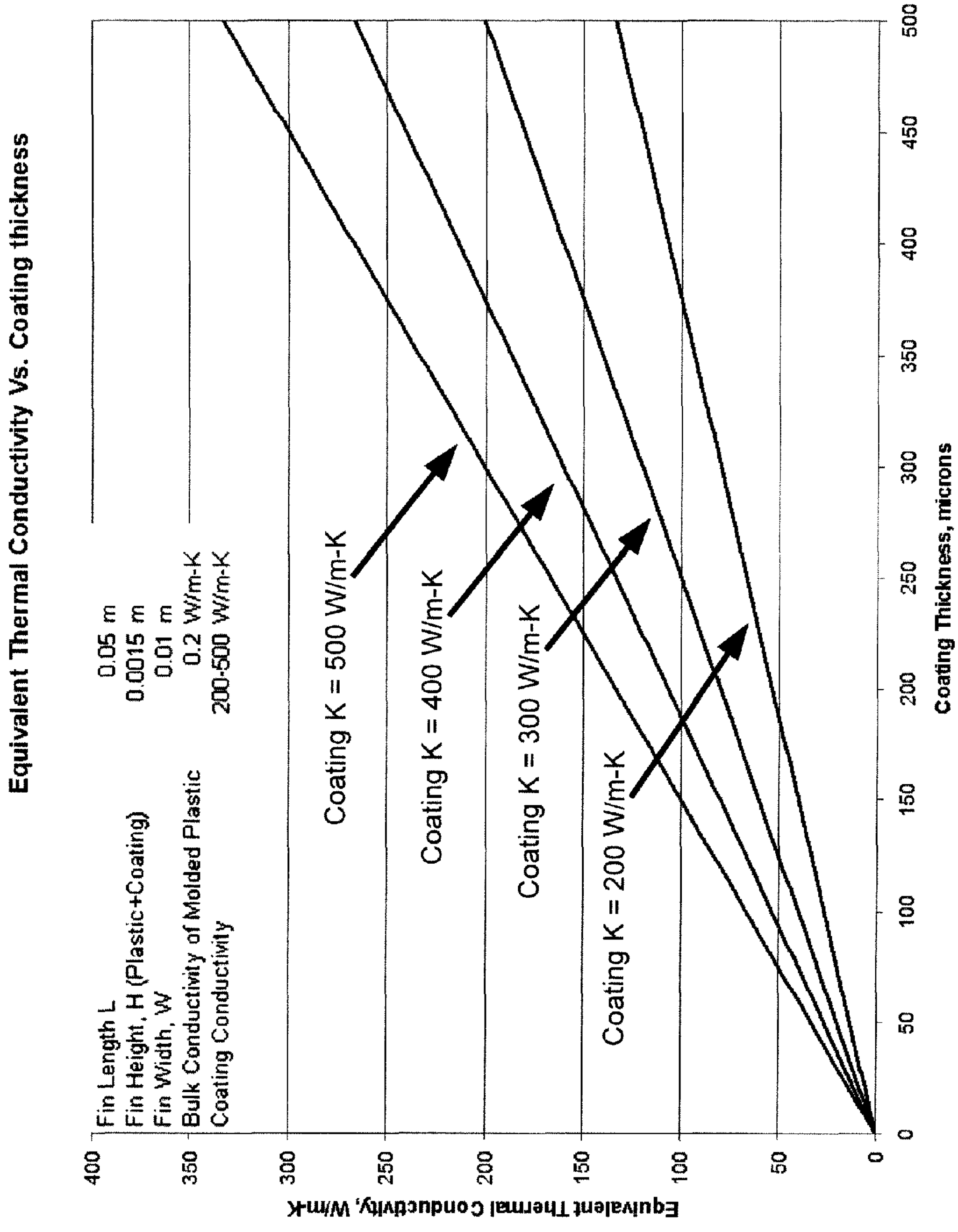
FIG. 8 plots coating thickness versus equivalent thermal conductivity data for a simplified "slab" type heat sink portion (e.g., a planar "fin").

With reference to FIG. 8, simulation data are shown for optimizing the thickness of the thermally conductive layer for a material thermal conductivity in a range of 200-500 W/m-K, which are typical copper material thermal conductivities for various types of copper. (It is to be appreciated that, as used herein, the term "copper" is intended to encompass various copper alloys or other variants of copper). The heat sink body in this simulation has a material thermal conductivity of 2 W/m-K, but it is found that the results are only weakly dependent on this value. The values of FIG. 8 are for a simplified "slab" heat sink having length 0.05 m, thickness 0.0015 m, and width 0.01 meters, with the thermally conductive material coating both sides of the slab. This may, for example, corresponding to a heat sink portion such as a planar fin defined by the plastic heat sink body and plated with copper of thickness 200-500 W/m-K. It is seen in FIG. 8 that for 200 W/m-K material a copper thickness of about 350 microns provides an equivalent (bulk) thermal conductivity of 100 W/m-K. In contrast, more thermally conductive 500 W/m-K material, a thickness of less than 150 microns is sufficient to provide an equivalent (bulk) thermal conductivity of 100 W/m-K. Thus, a plated copper layer having a thickness of a few hundred microns is sufficient to provide steady state performance related to heat conduction and subsequent heat removal to the ambient via radiation and convection that is comparable with the performance of a bulk metal heat sink made of a metal having thermal conductivity of 100 W/m-K.

In general, the sheet thermal conductance of the thermally conductive layer 14 should be high enough to ensure the heat from the LED devices 32 is spread uniformly across the heat radiating/convecting surface area. In simulations performed by the inventors, it has been found that the performance improvement with increasing thickness of the thermally conductive layer 14 (for a given material thermal conductivity) flattens out once the thickness exceeds a certain level (or, more precisely, the performance versus thickness curve decays approximately exponentially). Without being limited to any particular theory of operation, it is believed that this is due to the heat sinking to the ambient becoming limited at higher thicknesses by the radiative/convectivethermal resistance $R_{convection}$ and $R_{IR}$ rather than by the thermal resistance $R_{conduction}$ of the heat transfer through the thermally conductive layer. Said another way, the series thermal resistance $R_{conduction}$ becomes negligible compared with $R_{convection}$ and $R_{IR}$ at higher layer thicknesses.

Figure 9:
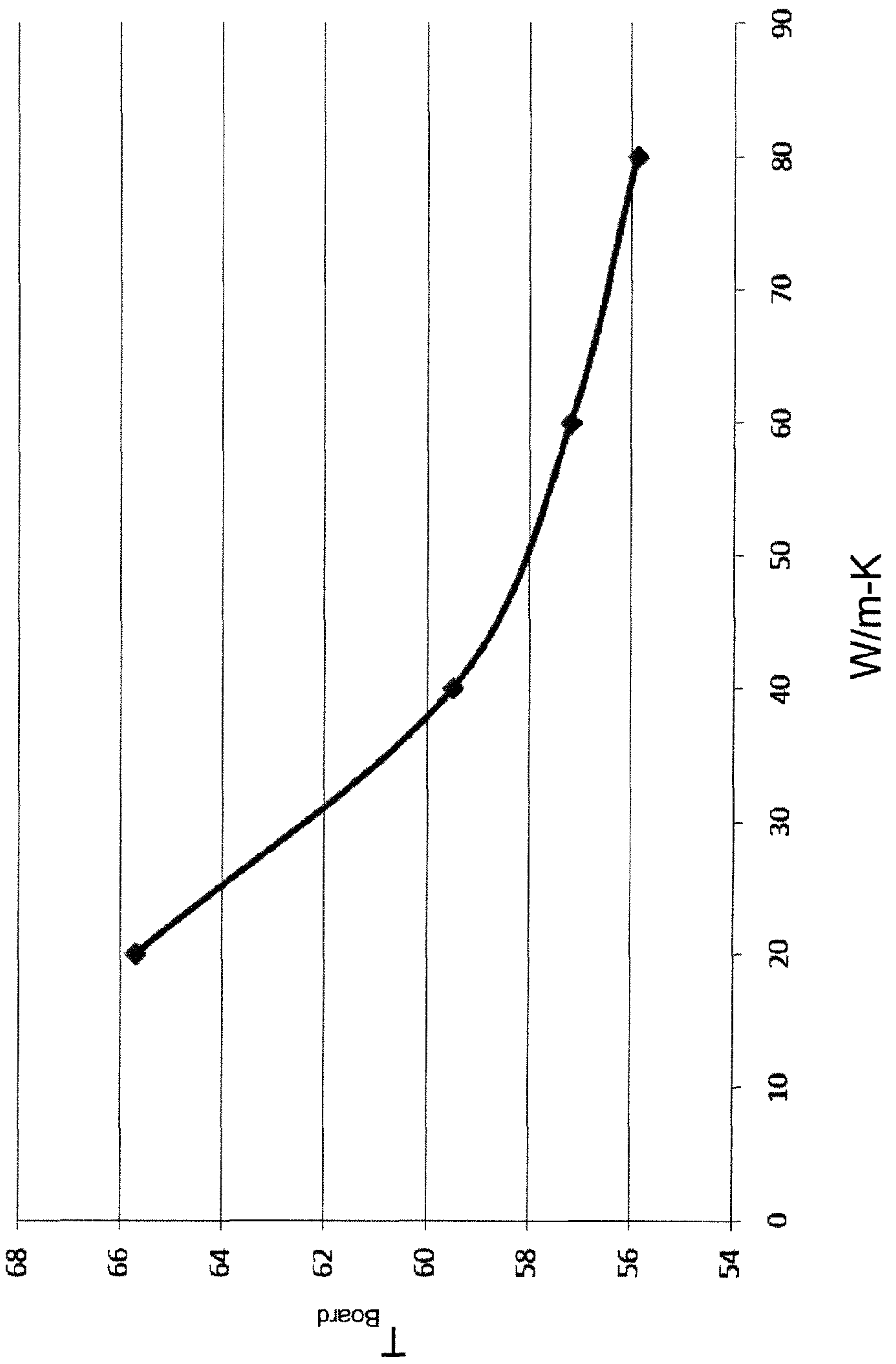
FIGS. 9 and 10 show thermal performance as a function of material thermal conductivity for a bulk metal heat sink.
Figure 10:
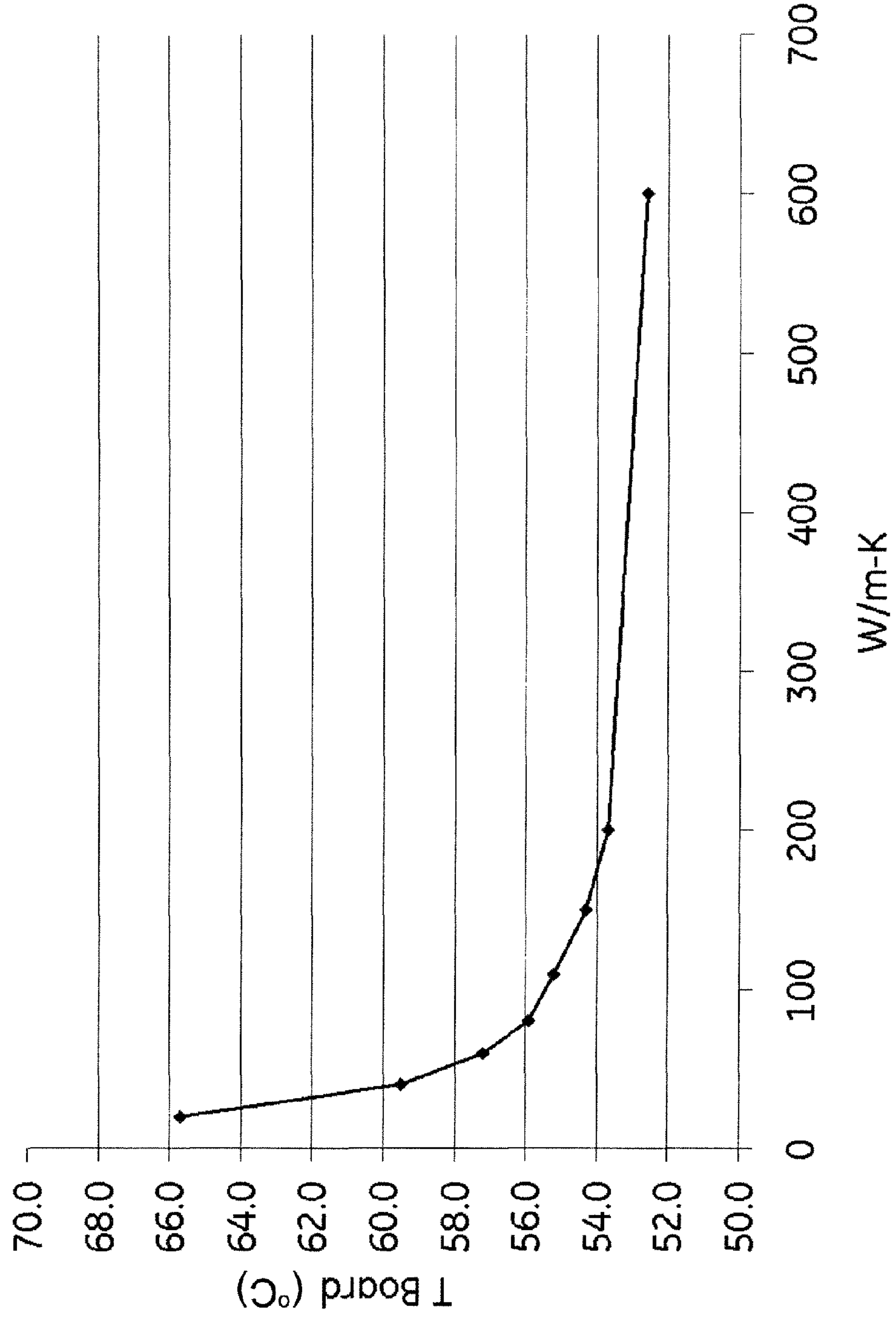

With reference to FIGS. 9 and 10, similar performance flattening with increasing material thermal conductivity is seen in thermal simulations of a bulk metal heat sink. FIG. 9 shows results obtained by simulated thermal imaging of a bulk heat sink for four different material thermal conductivities: 20 W/m·K; 40 W/m·K; 60 W/m·K; and 80 W/m·K. The temperature on the printed circuit board on which the LEDs are mounted ($T_{board}$) for each simulation is plotted in FIG. 9. It is seen that the $T_{board}$ temperature drop begins to level off at 80 W/m·K. FIG. 10 plots $T_{board}$ temperature versus material thermal conductivity of the bulk heat sink material for thermal conductivities out to 600 W/m·K, which shows substantial performance flattening by the 100-200 W/m·K range. Without being limited to any particular theory of operation, it is believed that this is due to the heat sinking to the ambient becoming limited at higher (bulk) material conductivities by the radiative/convective thermal resistance $R_{convection}$ and $R_{IR}$ rather than by the thermal resistance $R_{conduction}$ of the heat transfer through the thermally conductive layer. Said another way, the series thermal resistance $R_{conduction}$ becomes negligible compared with $R_{convection}$ and $R_{IR}$ at high (bulk) material thermal conductivity.

Based on the foregoing, in some contemplated embodiments the thermally conductive layer 14 has a thickness of 500 micron or less and a thermal conductivity of 50 W/m·K or higher. For copper layers of higher material thermal conductivity, a substantially thinner layer can be used. For example, aluminum typically has a (bulk) thermal conductivity of about 100-240 W/m·K, depending on the alloy composition. From FIG. 8, it is seen that heat sinking performance exceeding that of a bulk aluminum heat sink is achievable for a 500 W/m·K copper layer having a thicknesses of about 150 microns or thicker. Heat sinking performance exceeding that of a bulk aluminum heat sink is achievable for a 400 W/m·K copper layer having a thicknesses of about 180 microns or thicker. Heat sinking performance exceeding that of a bulk aluminum heat sink is achievable for a 300 W/m·K copper layer having a thicknesses of about 250 microns or thicker. Heat sinking performance exceeding that of a bulk aluminum heat sink is achievable for a 200 W/m·K copper layer having a thicknesses of about 370 microns or thicker. In general, the material thermal conductivity and layer thickness scale in accordance with the thermal sheet conductivity $K_s = \sigma \cdot d$.

Figure 11:
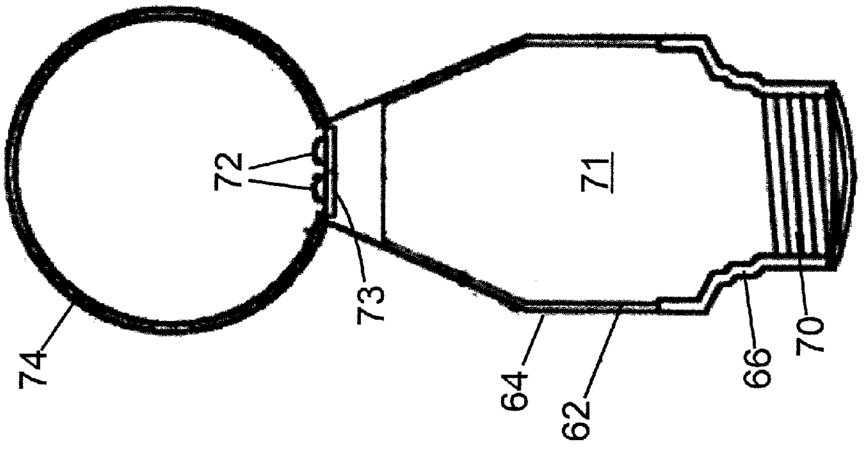
FIG. 11 diagrammatically shows a side sectional view of an "A-line bulb" lamp incorporating a heat sink as disclosed herein.
Figure 12:
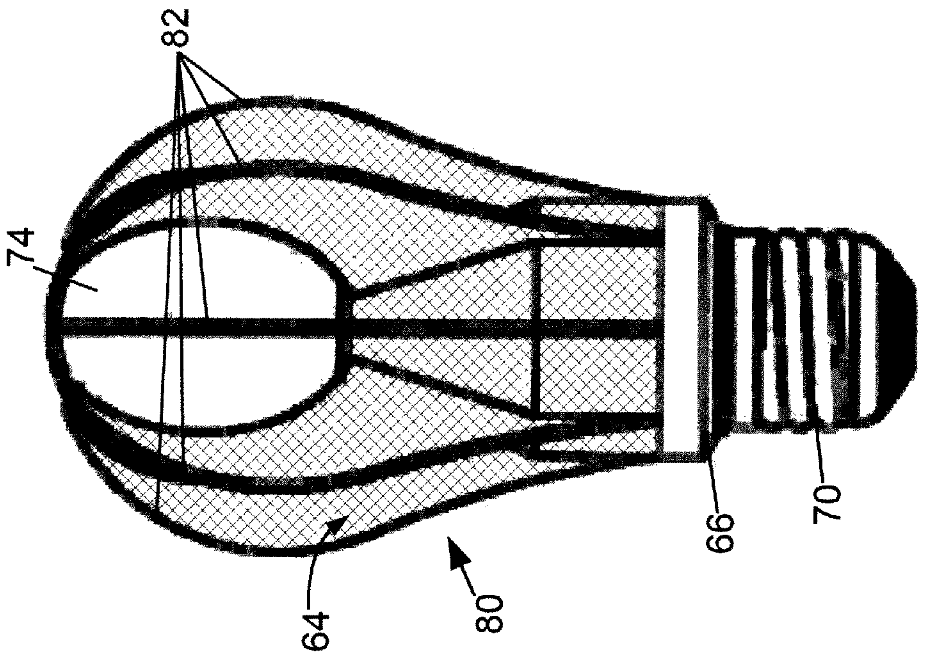
FIG. 12 diagrammatically shows a side perspective view of a variation of the "A-line bulb" lamp of FIG. 9, in which the heat sink includes fins.

With reference to FIGS. 11 and 12, the disclosed heat sink aspects can be in incorporated into various types of LED-based lamps.

FIG. 11 shows a side sectional view of an "A-line bulb" lamp of a type that is suitable for retrofitting incandescent A-line bulbs. A heat sink body 62 forms a structural foundation, and may be suitably fabricated as a molded plastic element, for example made of a polymeric material such as poly propylene, polycarbonate, polyimide, polyetherimide, poly(methyl methacrylate), nylon, polyethylene, epoxy resin, polyisoprene, sbs rubber, polydicyclopentadiene, polytetrafluoroethulene, poly(phenylene sulfide), poly(phenylene oxide), silicone, polyketone, thermoplastics, or so forth. A thermally conductive layer 64, for example comprising a copper layer, is disposed on the heat sink body 62. The thermally conductive layer 64 can be manufactured in the same way as the thermally conductive layer 14 of the MR/PAR lamp embodiments of FIGS. 3-5 and 7, e.g. in accordance with the operations S2, S3, S4, S5, S6 of FIG. 8.

A lamp base section 66 is secured with the heat sink body 62 to form the lamp body. The lamp base section 66 includes a threaded Edison base 70 similar to the Edison base 40 of the MR/PAR lamp embodiments of FIGS. 3-5 and 7. In some embodiments the heat sink body 62 and/or the lamp base section 66 define a hollow region 71 that contains electronics (not shown) that convert electrical power received at the Edison base 70 into operating power suitable for driving LED devices 72 that provide the lamp light output. The LED devices 72 are mounted on a metal core printed circuit board (MCPCB) or other heat-spreading support 73 that is in thermal communication with the thermally conductive layer 64. Good thermal coupling between the heat spreader 73 and the thermally conductive layer 64 may optionally be enhanced by soldering, thermally conductive adhesive, or so forth.

To provide a substantially omnidirectional light output over a large solid angle (e.g., at least 2π steradians) a diffuser 74 is disposed over the LED devices 72. In some embodiments the diffuser 74 may include (e.g., be coated with) a wavelength-converting phosphor. For LED devices 72 producing a substantially Lambertian light output, the illustrated arrangement in which the diffuser 74 is substantially spheroidal or ellipsoidal and the LED devices 72 are located at a periphery of the diffuser 74 enhances omnidirectionality of the output illumination.

With reference to FIG. 12, a variant "A-line bulb" lamp is shown, which includes the base section 66 with Edison base 70 and the diffuser 74 of the lamp of FIG. 11, and also includes the LED devices 72 (not visible in the side view of FIG. 12). The lamp of FIG. 12 includes a heat sink 80 analogous to the heat sink 62, 64 of the lamp of FIG. 11, and which has a heat sink body (not visible in the side view of FIG. 12) that is coated with the thermally conductive layer 64 (indicated by cross-hatching in the side perspective view of FIG. 12) disposed on the heat sink body. The lamp of FIG. 12 differs from the lamp of FIG. 11 in that the heat sink body of the heat sink 80 is shaped to define fins 82 that extend over portions of the diffuser 74. Instead of the illustrative fins 82, the heat sink body can be molded to have other heat radiation/convection/surface area enhancing structures.

In the embodiment of FIG. 12, it is contemplated for the heat sink body of the heat sink 80 and the diffuser 74 to comprise a single unitary molded plastic element. In this case, however, the single unitary molded plastic element should be made of an optically transparent or translucent material (so that the diffuser 74 is light-transmissive). Additionally, if the thermally conductive layer 64 is optically absorbing for the lamp light output (as is the case for copper, for example), then as shown in FIG. 12 the thermally conductive layer 64 should coat only the heat sink 80, and not the diffuser 74. This can be accomplished by suitable masking of the diffuser surface during the electroless copper plating operation S3, for example. (The electroplating operation S4 plates copper only on the conductive surfaces—accordingly, masking during the electroless copper plating operation S3 is sufficient to avoid electroplating onto the diffuser 74).

Figure 14:
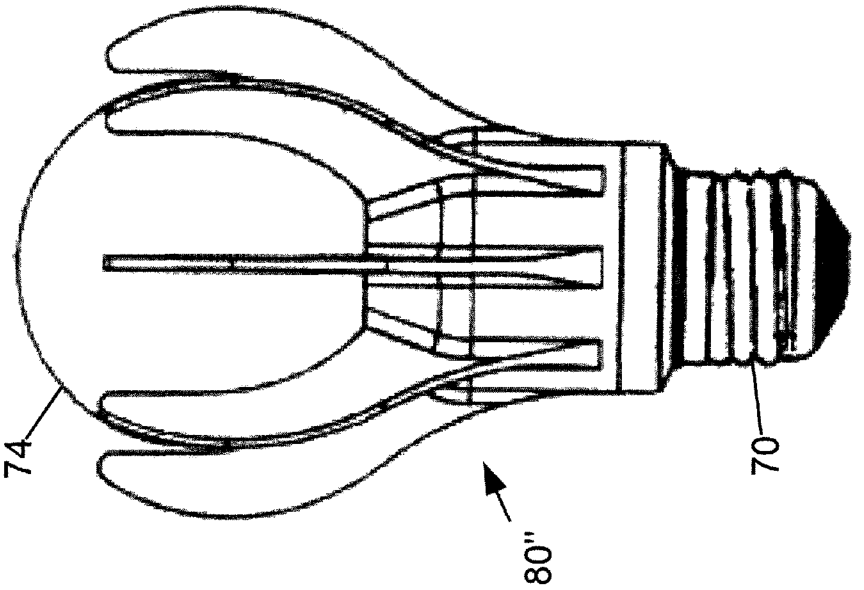
FIGS. 13 and 14 diagrammatically show side perspective views of additional embodiments of finned "A-line bulb" lamps.
Figure 13:
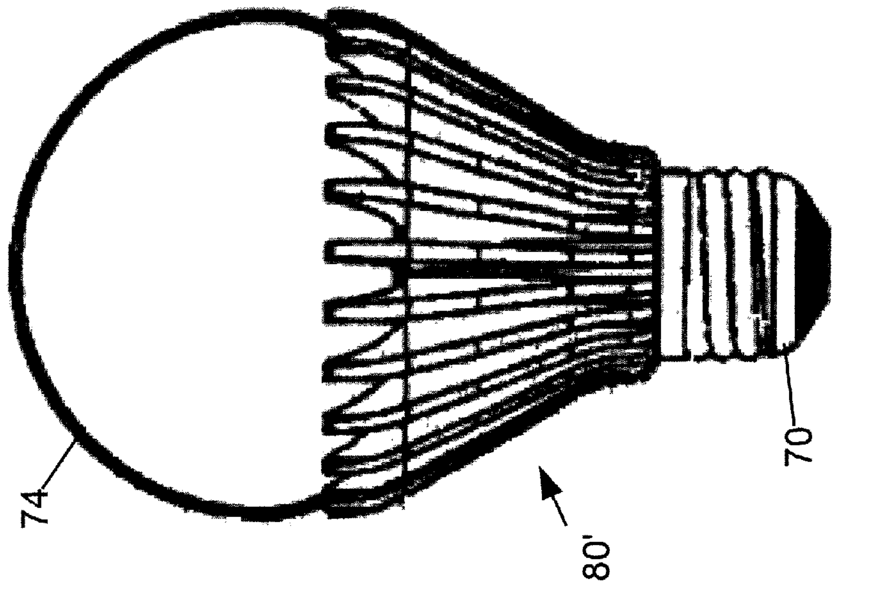
Figure 16:
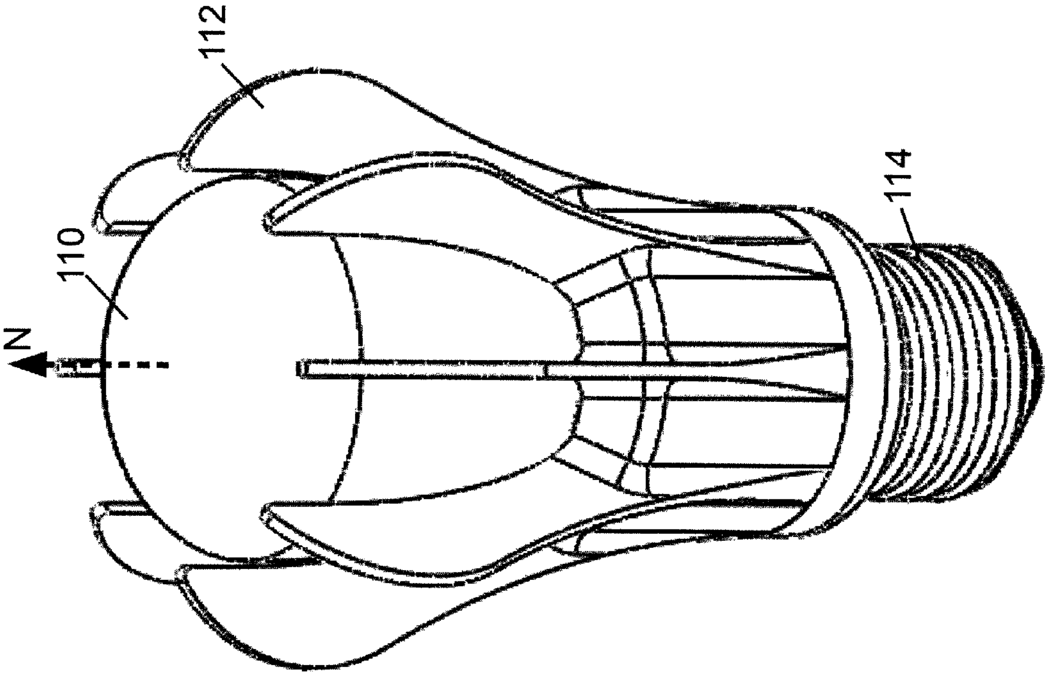
FIGS. 16-20 show perspective, alternative perspective, side, top, and bottom views, respectively, of an A19-type LED-based lamp or LED-based replacement light bulb having a heat sink including a reflective layer and a light transmissive protective layer disposed over the reflective layer.
Figure 17:
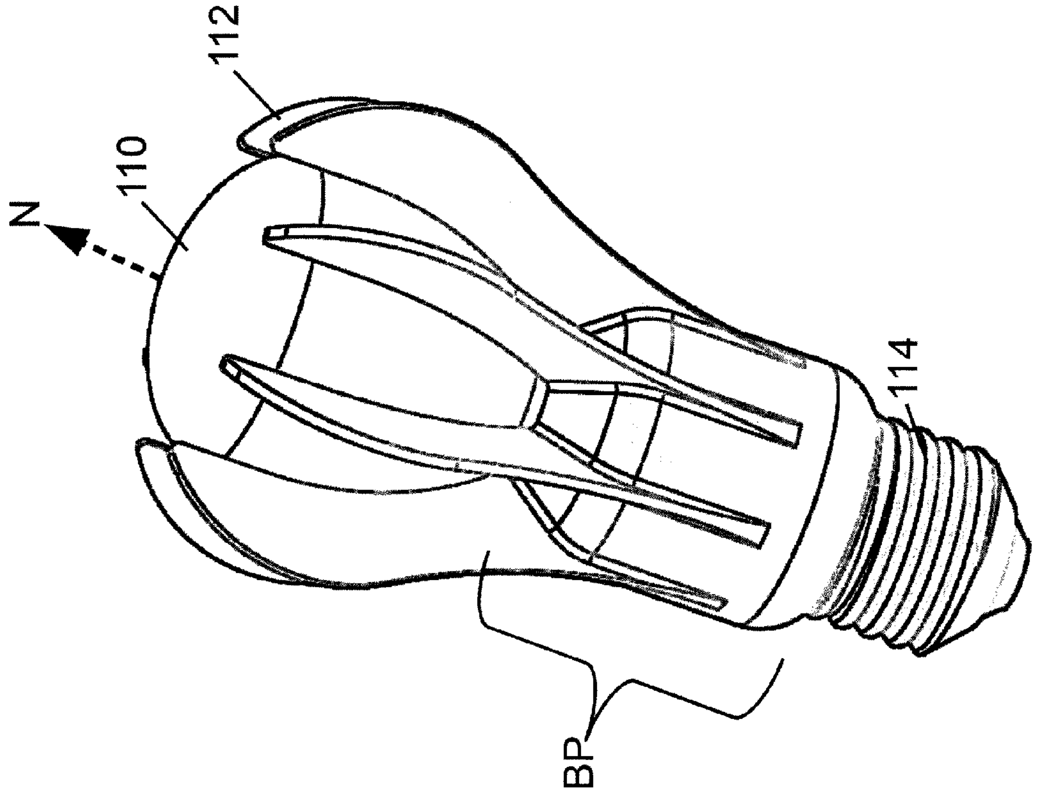

FIGS. 13 and 14 show alternative heat sinks 80', 80" that are substantially the same as the heat sink 80, except that the fins do not extend as far over the diffuser 74. In these embodiments the diffuser 74 and the heat sink body of the heat sink 80', 80" may be separately molded (or otherwise separately fabricated) elements, which may simplify the processing to dispose the thermally conductive layer 64 on the heat sink body.

FIG. 15 shows calculations for weight and material cost of an illustrative PAR-38 heat sink fabricated as disclosed herein using copper plating of a plastic heat sink body, as compared with a bulk aluminum heat sink of equal size and shape. This example assumes a polypropylene heat sink body plated with 300 microns of copper. Material costs shown in FIG. 15 are merely estimates. The weight and material cost are both reduced by about one-half as compared with the equivalent bulk aluminum heat sink. Additional cost reduction is expected to be realized through reduced manufacture processing costs.

Attention is now turned to optical and combined optical/thermal aspects of disclosed heat sinks.

With reference to FIGS. 16-20, an A19-type LED-based lamp or LED-based replacement light bulb is described. The illustrative lamp embodiment, which is suitable for use as an LED-based light bulb, is shown in FIGS. 16-20 (showing perspective, alternative perspective, side, top, and bottom views, respectively). The illustrated LED lamp includes a diffuser 110; a filmed heat sink 112; and a base 114. An Edison base is shown in the illustrated embodiment; however, a GU, bayonet-type or other type of base is also contemplated. The diffuser 110 is similar to the diffuser 74 of FIG. 11, but has an ovoid shape which has been found to provide improved omnidirectional illumination. The heat sink 112 includes fins that extend over a portion of the diffuser 110, and the heat sink 112 also includes a body portion BP (labeled in FIGS. 17 and 18) that houses power conditioning electronics (not shown) that convert 110V AC input electrical power (or 220 V AC, or other selected input electrical power) to electrical power suitable for driving LEDs that input light into an aperture of the diffuser 110. The diffuser 110 is illuminated by an LED-based light source arranged at the aperture similarly to the arrangement shown in FIG. 11 for the spherical diffuser 74. The illustrated diffuser 110 has an ovoid shape with a single axis-of-symmetry lying along the direction N of the elevation or latitude coordinate θ=0 corresponding to "geographic north" or "N". The illustrative ovoid diffuser 110 has rotational symmetry about the axis-of-symmetry or direction N. The illustrative ovoid diffuser 110 comprises an ovoid shell having a hollow interior, and is suitably manufactured of glass, transparent plastic, or so forth. Alternatively, it is contemplated for the ovoid diffuser to be a solid component comprising a light-transmissive material such as glass, transparent plastic, or so forth. The ovoid diffuser 110 may also optionally include a wavelength-converting phosphor disposed on or in the diffuser, or in the interior of the diffuser. The diffuser 110 is made light diffusive by any suitable approach, such as surface texturing, and/or light-scattering particles dispersed in the material of the ovoid shell, and/or light-scattering particles disposed on a surface of the ovoid shell, or so forth. The ovoid diffuser 110 has an egg shape, and includes a relatively narrower proximate section proximate to the body portion BP of the heat sink 112, and a relatively broader distal section distal from the body portion BP of the heat sink 112. The fins of the heat sink 112 produce relatively less optical losses for the distal section of the diffuser 110 as compared with the proximate section. Because the fins of the heat sink 12 have substantially limited extent in the longitudinal (ϕ) direction, the fins 120 are expected to not strongly impact the omnidirectional illumination distribution in the longitudinal direction. However, measurements performed by the inventors indicate that the fins do produce some reduction in light output, especially at angles directed "downward", that is, in a direction more than 90° away from the north direction N. Without being limited to any particular theory of operation, these optical losses are believed to be due to light absorption, light scattering, or a combination thereof caused by the fins. Moreover, the body portion BP of the heat sink 112 (or, more generally, the body portion of the lamp) further limits the amount of omnidirectional illumination in the "downward" direction. The ovoid shape of the ovoid diffuser 110 has been found to reduce optical loss caused by the fins of the heat sink 112. Briefly stated, the ovoid shape increases the surface area of the relatively narrower proximal section so as to increase light output in the "downward" direction, as compared with the smaller-area distal section, so as to compensate for optical losses caused by the heat sink 112 and generate more omnidirectional illumination (as that term is commonly used in the art, for example in the Energy Star® Program Requirements for Integral LED Lamps, finalized Dec. 3, 2009).

The foregoing optical analysis assumes that the heat sink 112 has diffusely reflecting surfaces. With reference back to FIG. 7, the optional operation(s) S6 can include applying a white powder coating such as a metal oxide powder (e.g., titanium dioxide powder, aluminum oxide powder, or a mixture thereof, or so forth). Such a white powder provides a reflective surface.

However, it is recognized herein that such a reflective surface provides a rather diffuse reflection, with only a few percent of the incident light being reflected specularly (and thus forming a visually perceived reflection) and the remainder being reflected diffusely, while a very small percent is absorbed. Additionally, the white powder can interfere with the convective/radiative heat dissipation provided by the heat sink. In quantifying the amount of specular vs. diffuse reflection, it is convenient to adopt the definition of Total Integrated Scatter (TIS) (see, e.g., Optical Scattering, John C. Stover, page 23, SPIE Press, 1995) given by $$TIS = \frac{P_s}{R * P_i},$$

where $P_i$ is the power incident onto a surface, typically at normal incidence, R is the total reflectance of the surface, and $P_s$ is the scattered power, integrated over all angles not encompassed by the specular reflectance angle. Typically, the angular integration of the scattered light is performed for all angles larger than some small angle that is typically ~a few degrees or less. For the case of general illumination systems like lamps and luminaires, the intensity distribution in the beam pattern is typically controlled with precision ~1° to 5°. Therefore in such applications, the angular integration of the scattered light in the definition of TIS would include scatter angles exceeding ~1°.

Figure 18:
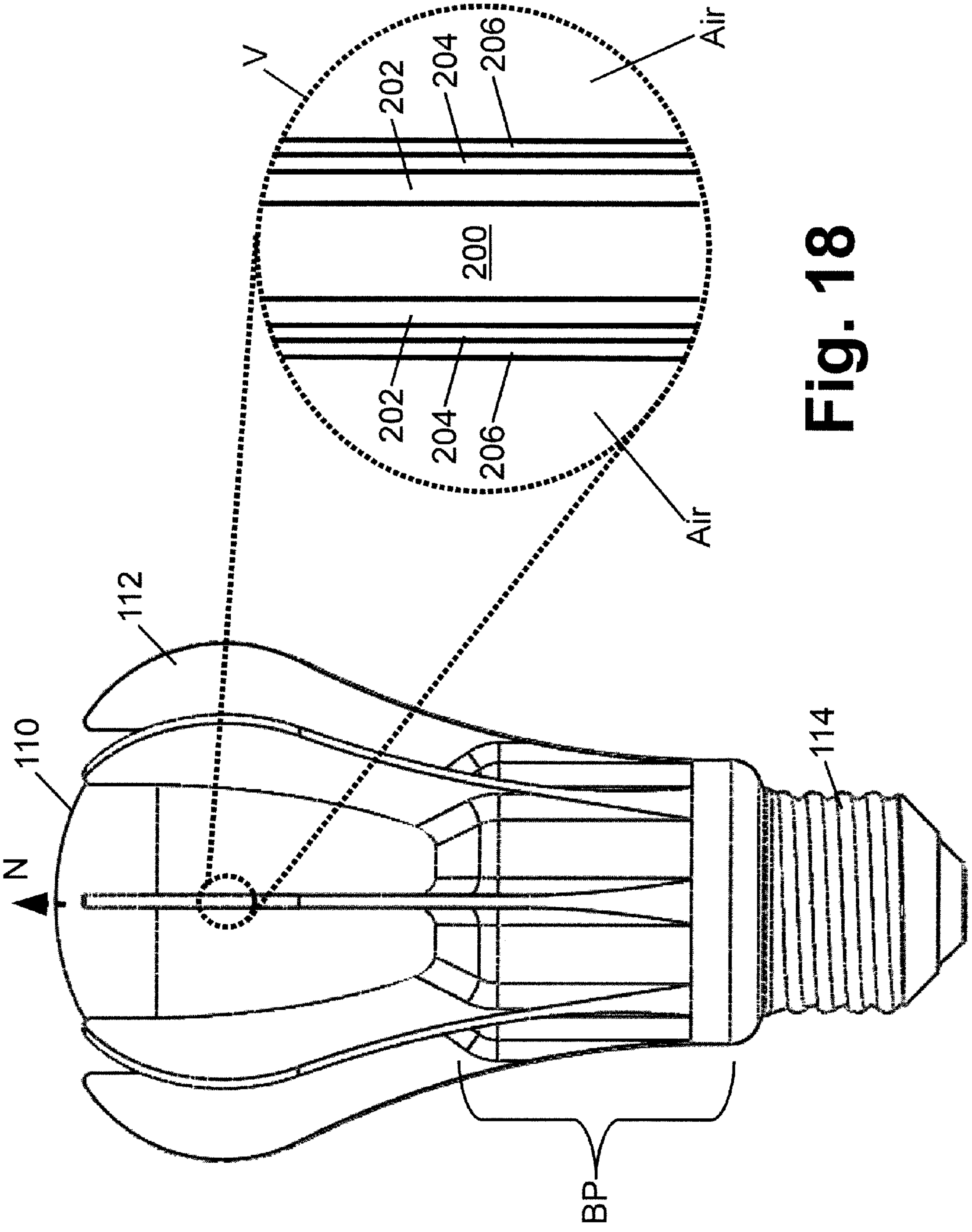
Figure 19:
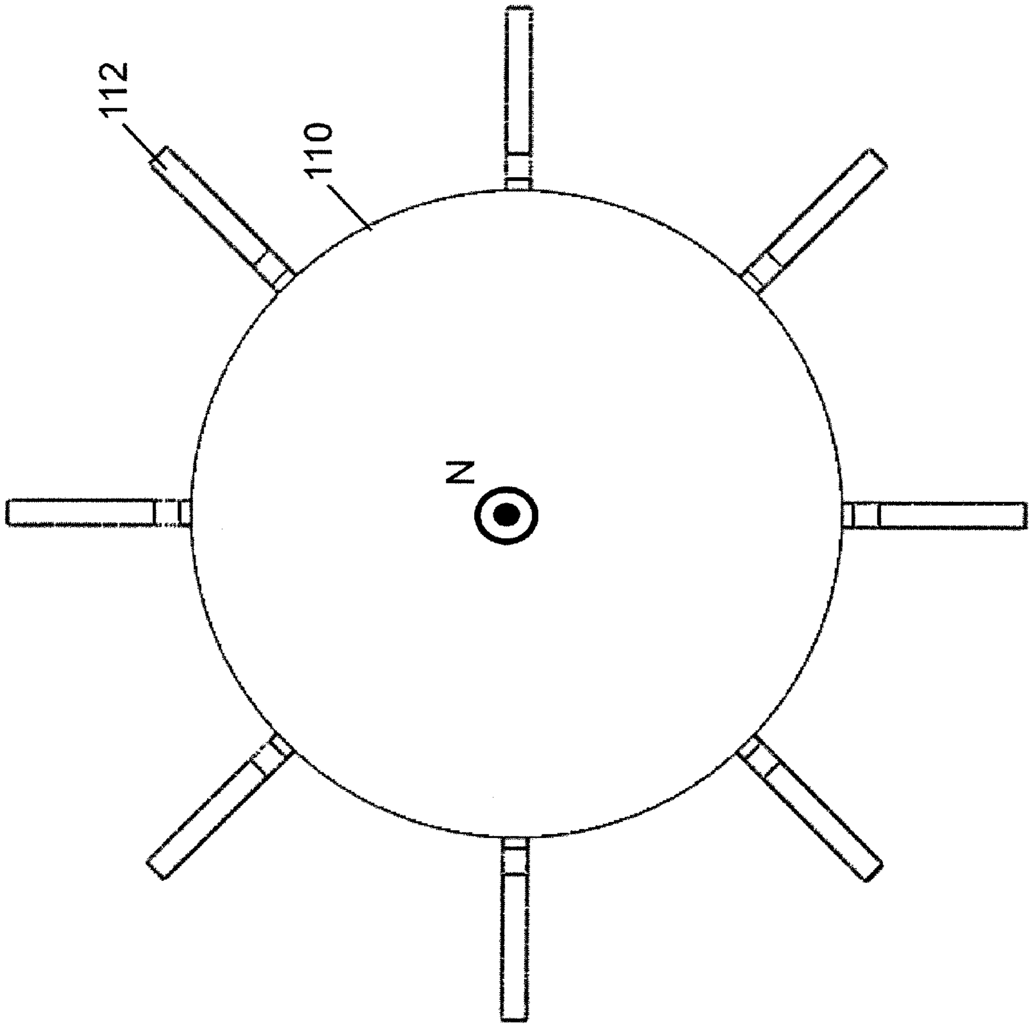
Figure 20:
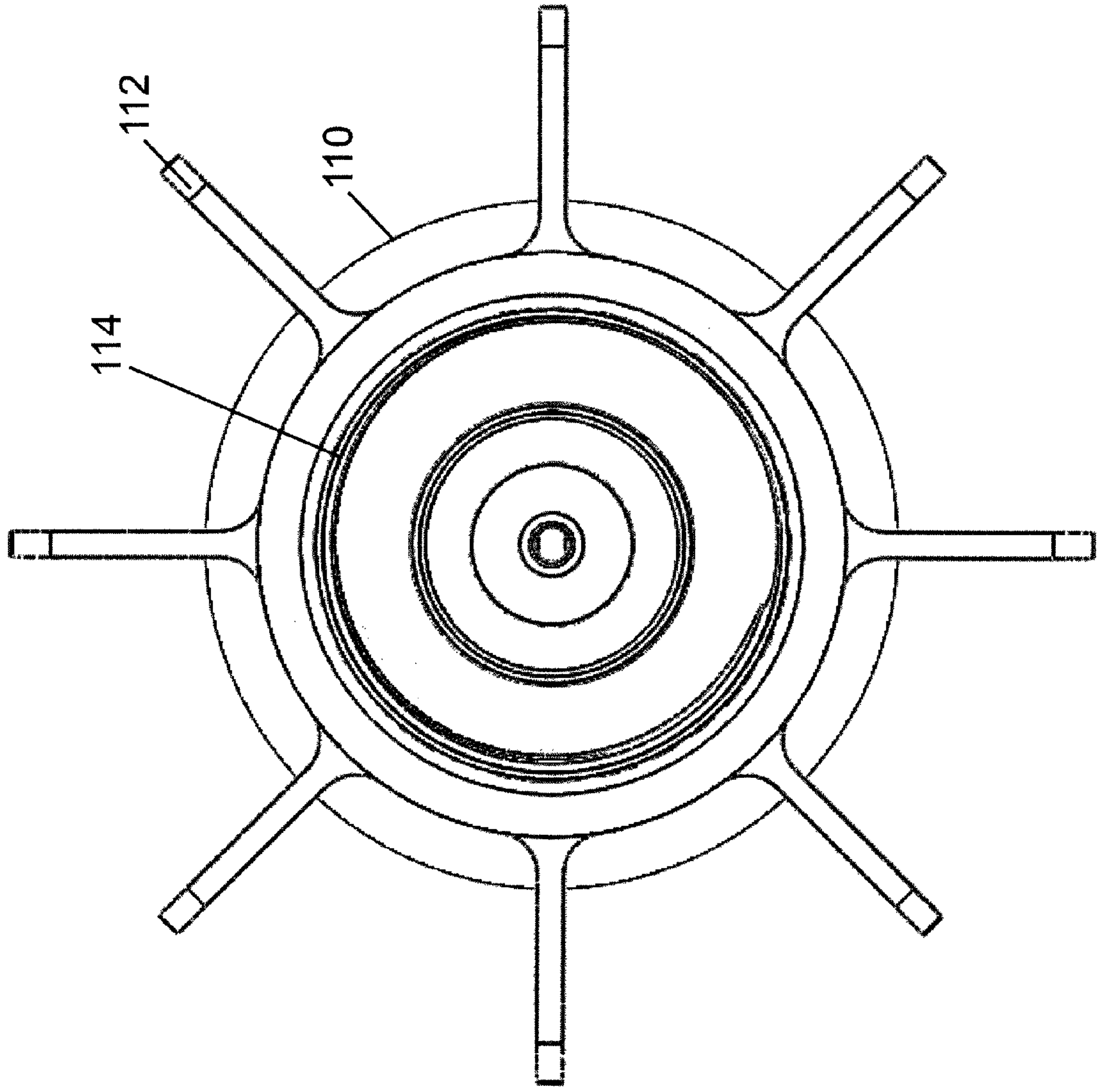

With particular reference to FIG. 18, an embodiment of the heat sink surface is shown by way of an illustrative small sectional view V of a portion of one of the fins of the heat sink 112. The illustrative heat sink includes a plastic heat sink fin body 200 which is part of the plastic heat sink body as already described. The heat sink fin body 200 is coated at both external surfaces by an electroplated copper layer 202, for example suitably formed on the heat sink fin body 200 by the operations S2, S2, S3, S4 as described with reference to FIG. 7. The copper layer 202 may, for example, be about 300 microns thick, or may have another suitable thickness determined based on FIG. 8 or another suitable design approach. The copper layer 202 is coated by a reflective layer 204, such as a silver layer, by electroplating or another suitable approach. The reflective layer 204 should be of sufficient thickness that incident light is reflected without an evanescent wave reaching the copper layer 202. If the reflective layer 204 is silver, a thickness of about one micron is sufficient, although a thicker layer or a somewhat thinner layer is also suitable. A light-transmissive protective layer 206 is disposed over the reflective layer 204. The light-transmissive protective layer 206 may, by way of example, comprise a light transmissive plastic layer or other light transmissive polymer layer, or a light transmissive glass or silica layer, or a light transmissive ceramic layer.

The light-transmissive protective layer 206 provides passivation for the reflective layer 204. For example, if the reflective layer 204 is silver, it will tarnish in the absence of the protective layer 206, and such tarnishing greatly reduces the reflectivity of the silver.

The light-transmissive protective layer 206 should also be optically transparent for lamp light emitted from the diffuser 110. In this way, light impinging on the surface of the heat sink 112 passes through the light-transmissive protective layer 206, reflects off of the reflective layer 204, and the reflected light passes back through the light-transmissive protective layer 206 as a reflection. In some embodiments, the reflective layer 204 has a "mirror-smooth" surface such that the multilayer structure 204, 206 provides specular reflection that obeys Snell's law (i.e., angle of reflection equals angle of incidence, both being measured off the surface normal). In some embodiments in which the multi-layer structure 204, 206 including the reflective layer 204 and the light transmissive protective layer 206 comprises a specular reflector having less than 10% light scattering. In some embodiments in which the multi-layer structure 204, 206 including the reflective layer 204 and the light transmissive protective layer 206 comprises a specular reflector having less than 5% light scattering. In some embodiments in which the multi-layer structure 204, 206 including the reflective layer 204 and the light transmissive protective layer 206 comprises a specular reflector having less than 1% light scattering. Although a specular reflector has substantial advantages, it is also contemplated for the multi-layer structure 204, 206 including the reflective layer 204 and the light transmissive protective layer 206 to be a more diffuse reflector, for example having substantially higher than 10% light scattering (but preferably with high reflectivity).

The light-transmissive protective layer 206 also impacts thermal characteristics of the heat sink 112. In order to both achieve high optical transparency and limit thermal impact, it might be expected that the light-transmissive protective layer 206 should be made as thin as practicable while still providing the desired surface protection. Under such guidelines, the protective layer might be made as thin as a few nanometers or a few tens of nanometers.

However, the inventors have recognized that making the light-transmissive protective layer 206 substantially thicker is actually more beneficial. In such a design, the material of the light-transmissive protective layer 206 is chosen to have low or ideally zero absorption (cc) or, equivalently, a small or ideally zero optical extinction coefficient (k) in the visible spectrum (or other spectrum of the light emitted by the diffuser 110). This condition is satisfied for most glass or silica layers and for many plastic or polymer layers, as well as for some ceramic layers. For sufficiently low or zero absorption (or extinction coefficient) the thickness of the light-transmissive protective layer 206 has negligible or no impact on the reflectivity of the multilayer structure 204, 206.

Thermally, it is recognized herein that the thickness of the light-transmissive protective layer 206 can be optimized to maximize the net heat transfer from the heat sink 112 to the ambient (or, more precisely for the case of the embodiment of FIG. 18, from the copper layer 202 to the ambient). This approach is based on the observation that the light transmissive protective layer 206 generally has a high emittance in the infrared, which may be substantially higher than the corresponding emittance of the reflective layer 204. For example, the material $SiO_2$ is more efficient at radiating heat (that is, emitting in the infrared, e.g. in the range ~3-20 microns wavelength) than silver. This can be seen as follows.

Assuming that the high reflectivity of the reflective layer 204 extends into the infrared spectrum (which is the case for most highly reflective metals, such as silver), it follows that the reflective layer 204 inherently has low (typically nearly zero) optical emittance in the infrared. The incident optical energy equals the sum of the absorbed energy plus the transmitted energy plus the reflected energy. For the highly reflective layer 204 nearly all of the incident optical energy is converted to reflected optical energy (that is, reflectivity ~1 and transmissivity ~0), and accordingly the absorbed optical energy is nearly zero. As optical emittance equals optical absorption, it follows that the reflective layer 204 has nearly zero optical emittance in the infrared. Said another way, the reflective layer 204 is a very poor blackbody radiator.

On the other hand, the light transmissive protective layer 206 is more absorbing in the infrared than the reflective layer 204. In other words, the low or zero absorption (or extinction coefficient) in the visible spectrum for $SiO_2$ and other suitable materials for the light transmissive protective layer 206 does not extend into the infrared, but rather the absorption (or extinction coefficient) rises as the spectrum extends into the infrared. As a consequence, the light transmissive protective layer 206 has higher emittance in the infrared as compared with the reflective layer 204. Said another way, the light transmissive protective layer 206 is a better blackbody radiator in the infrared than the reflective layer 204.

However, the light transmissive protective layer 206 can only radiate the heat that it receives as an element in the thermal circuit between the LED (heat source) and the ambient air. The light transmissive protective layer 206 primarily receives heat by conduction and radiation from the adjacent underlying reflective layer 204. If the light transmissive protective layer 206 is too thin, then it will absorb little heat, and the blackbody radiation from the layer stack 204, 206 will be dominated by the poor blackbody radiator properties of the reflective layer 204. On the other hand, at some point the light transmissive protective layer 206 becomes sufficiently thick to be substantially completely opaque to the heat that is radiated from the reflective layer 204.

The foregoing principles are further illustrated with reference to "Appendix A—Determination of a suitable coating thickness for a composite heat sink including a highly specularly reflecting layer coated by a light transmissive protective layer". Appendix A discloses quantitative determination of suitable thicknesses for the light transmissive protective layer 206. Based on these calculations, it is desired that the light transmissive protective layer 206 be optically thick for infrared radiation. Depending upon the material and the desired heat flux, in some embodiments the light transmissive protective layer should be greater than or equal to one micron. As seen in FIGS. A-2 and A-3 of Appendix A, for typical dielectric or polymer materials such as $SiO_2$ a suitably optically thick layer is greater than or equal to three microns, and in some embodiments greater than or equal to 5 microns, and in some embodiments greater than or equal to 10 microns (which for typical $SiO_2$ is more than 50% absorbing for infrared radiation). In some embodiments, a higher thickness, e.g. greater than or equal to 20 microns, is also contemplated. As can be seen in. FIGS. A-2 and A-3, the thermal performance of the composite surface 204, 206 does not decrease quickly above about 10 micron, and so greater thicknesses for the light transmissive protective layer 206 are contemplated. Indeed, as seen in FIG. A-3 a thickness of several tens of microns is thermally acceptable for the light transmissive protective layer 206. However, increased deposition time and material cost bias against going to thicknesses substantially larger than 10 microns. Additionally, if the light transmissive protective layer 206 has non-zero absorption for visible light (i.e., extinction coefficient k not identically zero in the visible) then reduced optical reflectivity of the composite surface 204, 206 may result for thicknesses of the light transmissive protective layer 206 substantially larger than 10 microns. Accordingly, in some embodiments the light transmissive protective layer has a thickness of no more than 25 microns, and in some embodiments no more than 15 microns, and in some embodiments no more than 10 microns.

The composite surface 204, 206 shown in FIG. 18 in the context of the finned heat sink of a "light bulb" type lamp can also be used in other heat sinks in which a reflective surface is beneficial.

With reference back to FIG. 3, for example, a variant embodiment is indicated in which at least the inner surfaces 20 of the hollow generally conical heat sink include the composite surface comprising (in order) the copper layer 202, the reflective layer 204 (for example, a silver layer, in some embodiments mirror-smooth and hence specularly reflecting), and the light transmissive protective layer 206. In some embodiments only the inner surfaces 20 include the layers 204, 206 in order to provide high reflectivity, while the outer surfaces 22 may include only the copper layer 202 to provide thermal conduction (optionally further including a white powder coating or other cosmetic surface treatment). In other embodiments, both inner surfaces 20 and the outer surfaces 22 include the layers 204, 206—the optional inclusion of these layers on the outer surfaces 22 would typically be motivated by manufacturing convenience in the case of certain layer deposition techniques.

The illustrative heat sinks employ a heat sink body made of plastic or another suitable material as already described, in order to advantageously provide a lightweight heat sink. In any such heat sink, the additional layers 204, 206 may be included to provide high reflectivity combined with environmental robustness provided by the protective layer 206 and maintained or even improved thermal performance provided by the enhanced emittance of the light transmissive protective layer 206 as compared with a metal, e.g., silver or copper, outermost layer. If the reflective layer 204 is made sufficiently smooth, then the multilayer structure 204, 206 provides specular reflectivity, which can be advantageous for certain applications in which the heat sink serves as a reflective optical element.

In some embodiments the thermal conduction layer 202 and the reflective layer 204 may be combined as a single layer having the requisite thickness to provide thermal conduction and requisite reflectivity.

As yet another contemplated variation, the heat sink body may be wholly copper or aluminum or another thermally conductive metal or metal alloy, for example a bulk copper or aluminum heat sink (without any plastic or other lightweight heat sink body component) that is coated by the additional layers 204, 206 to provide a robust reflective surface with high thermal emittance.

The disclosed heat sinks facilitate new lamp designs.

Figure 21:
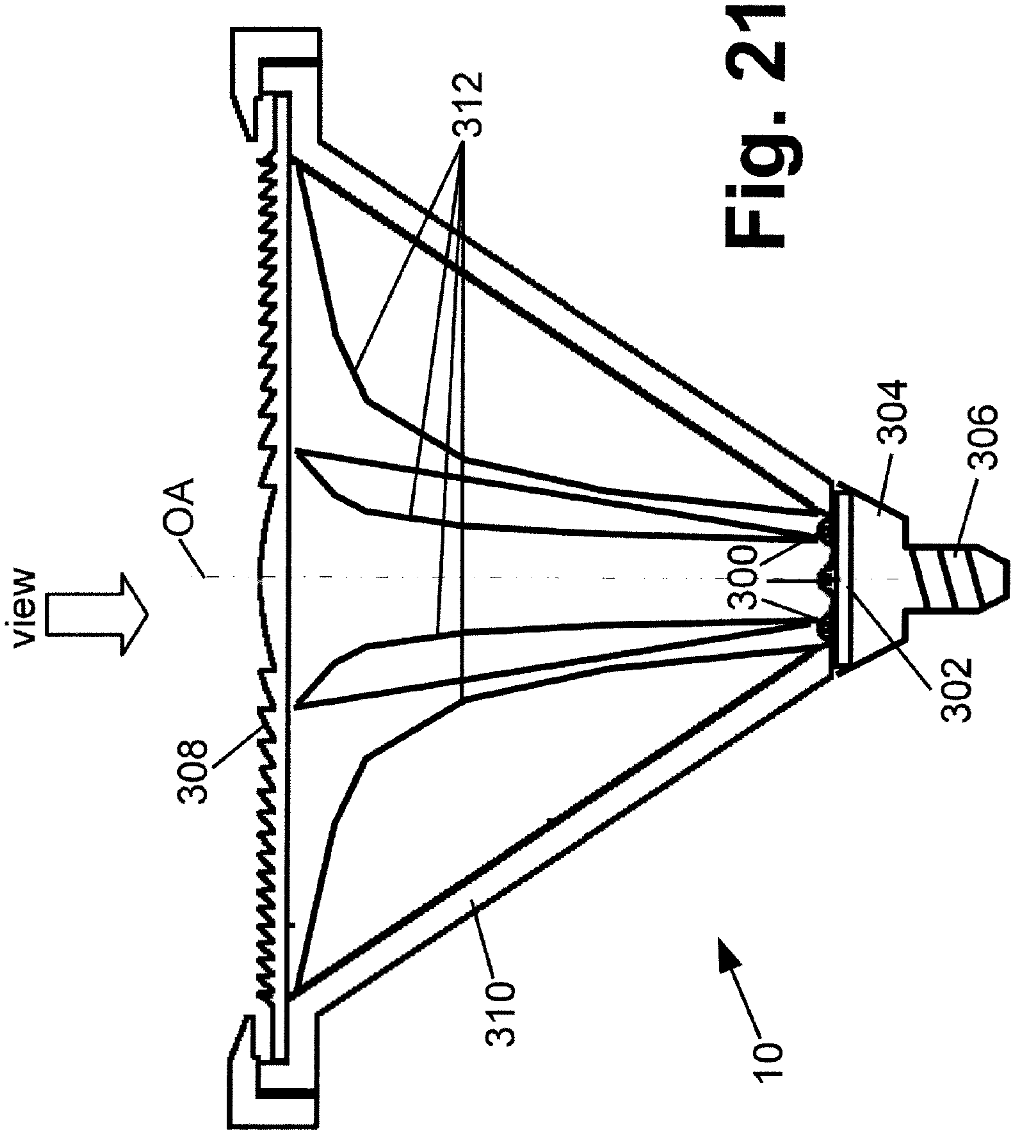
FIGS. 21 and 22 show side sectional and front views, respectively, of a directional lamp having reflective heat sinking fins disposed inside the conical reflector.
Figure 22:
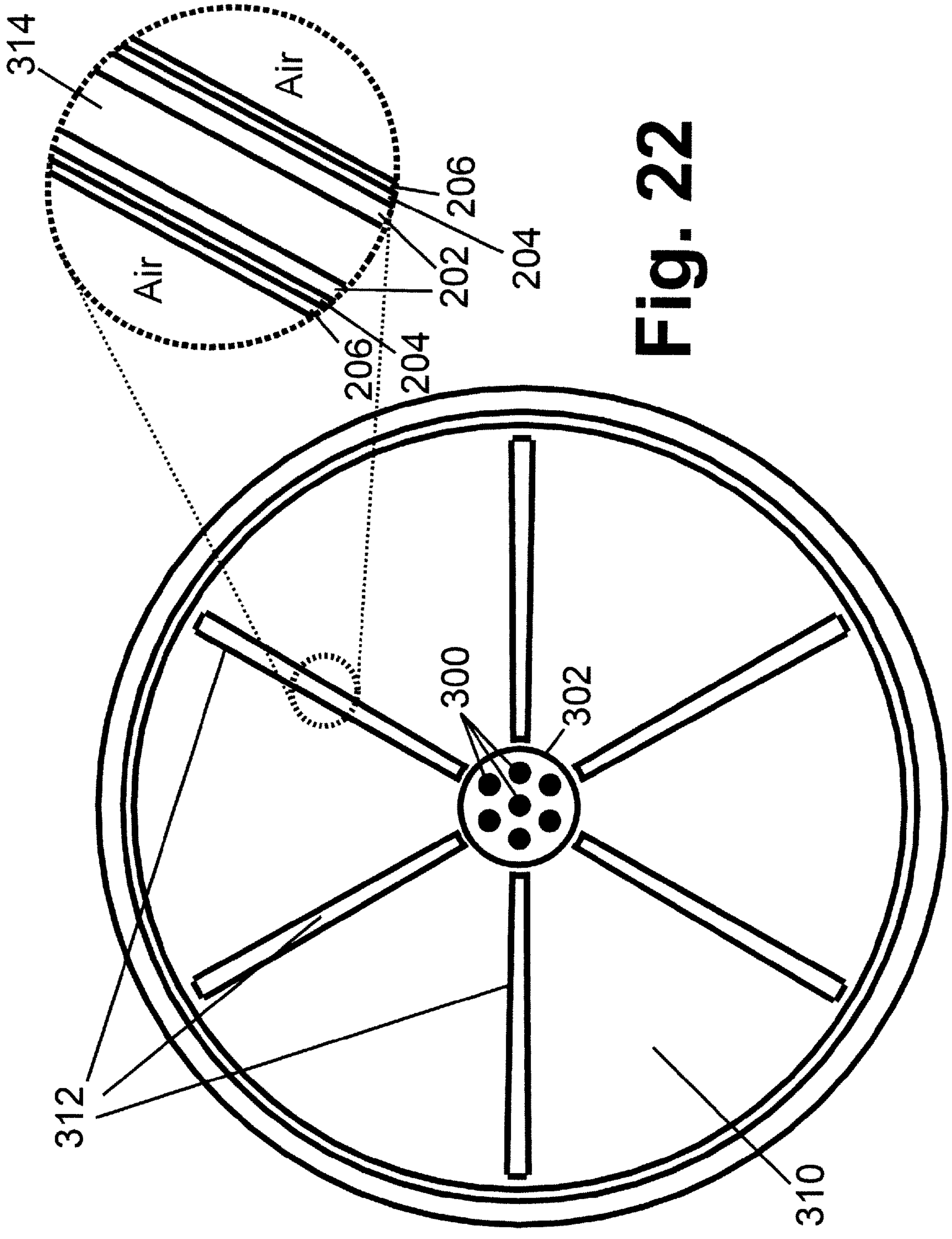

With reference to FIGS. 21 and 22, a directional lamp is shown. FIG. 21 shows a side-sectional view of the directional lamp, while FIG. 22 shows a view looking in the direction labeled "view" in FIG. 21. The directional lamp of FIGS. 21 and 22 includes one or more LED devices 300 disposed on a circuit board 302 mounted on a base 304 including suitable power conversion electronics (internal components not shown) to convert line AC voltage received at a threaded Edison-type base 306 into power suitable for operating the LED devices 300. The directional lamp further includes an optical system including a beam-forming Fresnel lens 308 and a conical reflector 310 cooperating to generate a directional beam along an optical axis OA. It is to be understood that the Fresnel lens 308 is transparent so that internal details that are "behind" the Fresnel lens 308 in the view of FIG. 22 are visible through the transparent lens in the view of FIG. 22.

The directional lamp of FIGS. 21 and 22 has certain similarities with the directional lamp of FIGS. 3-6. One similarity is that in both embodiments the conical reflector serves as a heat sink. However, in the embodiment of FIGS. 3-6 the heat sink has fins on the outside of the conical reflector. This arrangement is conventional, since it places the fins outside of the optical path. In contrast, in the directional lamp of FIGS. 21 and 22 includes fins 312 extending inwardly inside the conical reflector 310. These fins 312 include the composite or multilayer reflective surface including (in order) a planar fin body 314 made of plastic or another lightweight material, the thermal conductance layer 202 (e.g., a copper layer of 150-500 microns in some embodiments) coating both sides of the planar fin body 314, the reflective layer 204 (e.g., a silver layer having a thickness in a range of a few tenths of a micron to a few microns), and the light transmissive protective layer 206 (e.g., a $SiO_2$ or transparent plastic layer having a thickness in a range of about 3-15 microns). The composite layer structure 202, 204, 206 also coats the inner surface of the conical reflector 310 (that is, the surface visible in FIG. 22, analogous to the coating shown in detail in FIG. 3 for the directional lamp embodiment of FIGS. 3-6), and optionally also coats the outside surface of the conical reflector 310 (that is, the surface not visible in FIG. 22). Alternatively, the outside surface of the conical reflector 310 may be uncoated, or may be cosmetically treated for aesthetic reasons.

The use of the reflective (preferably specularly reflective, although diffuse reflective is also contemplated) yet also highly thermally conductive and thermally emissive and environmentally robust composite layer structure 202, 204, 206 facilitates the configuration of FIGS. 21 and 22 in which the fins 312 are located inside the conical reflector 310 and hence in the optical path. Conventional heat sinks have reflectivity of about 85% or lower for visible light. While this may seem high, it amounts to substantial optical losses, especially in the case of multiple reflections such as are prone to occur with inwardly extending fins inside of a conical reflector.

By contrast, the composite layer structure 202, 204, 206 provides reflectivity substantially the same as, or even better than, the native reflectivity of the high reflectivity layer 204. In the case of silver, this native reflectivity can be well above 90%, and is typically about 95%. The light transmissive protective layer 206 generally does not degrade this reflectivity, and can even improve the reflectivity due to surface passivation and/or refractive index matching. As a result, it is practical to employ the inwardly extending fins 312 in the directional lamp while still maintaining high optical efficiency.

The inwardly extending fins 312 have substantial advantages over the outwardly extending fins of the embodiment of FIGS. 3-6. By employing the inwardly extending fins 312 the directional lamp is made more compact and aesthetically pleasing. Additionally, if the directional lamp is mounted in a recessed fashion, outwardly extending fins may be spatially confined in a small recess which can substantially reduce their effectiveness. In contrast, the placement of the inwardly extending fins 312 in the optical path ensures that they face a substantially open volume, even in the case of recessed mounting. The inwardly extending fins 312 also tend to expel heat outward from the front of the lamp, whereas outwardly extending fins tend to expel heat "backward" toward the mounting surface or into the mounting cavity in the case of recessed mounting. The inwardly extending fins 312 also tend to preserve the optical performance of the conical reflector and beam-forming lens if the inwardly extending fins are specularly reflecting and are symmetrically arranged around the optical axis of the lamp, and if each fins lies on a radial plane parallel to the optical axis. In such a plane, each fin specularly reflects light into the beam pattern of the lamp such that the radial distribution of light in the beam is unchanged by the light reflected from the fin, and the azimuthal distribution of light in the beam pattern is rotationally invariant around the optical axis, regardless whether the light reflects from a fin, or is emitted from the lamp without reflecting from a fin.

Figure 23:
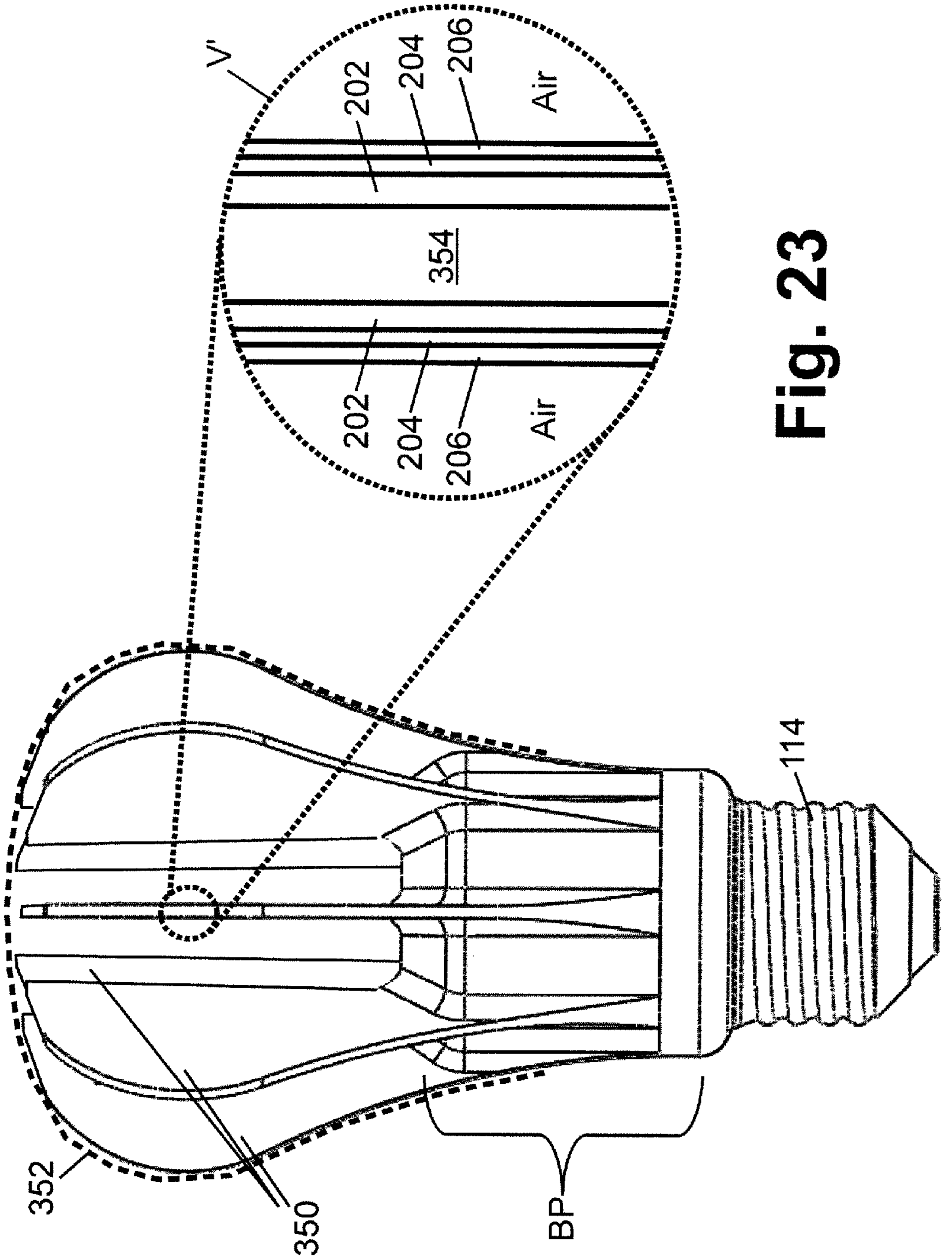
FIG. 23 shows a side view of a lamp having an A-line bulb shape similar to that of FIGS. 16-20 but having internal fins surrounded by a diffuser.

FIG. 23 shows a lamp similar to the lamp of FIGS. 16-20, with FIG. 23 showing the same side view as FIG. 18. The modified lamp of FIG. 23 replaces the finned heat sink 112 having fins external to the diffuser 110 with internal fins 350 that are surrounded by a larger diffuser 352 (translucent diffuser 352 indicated by dashed lines). The internal fins 350 can be made larger than corresponding external fins by extending further inward toward the center of the "bulb". If the diffuser 352 is sufficiently diffusive, then the internal fins 350 are either blocked from view or only diffusely viewable. Elimination of the external fins is expected to be considered to be an aesthetic enhancement for most people, and makes it easier to hold and manipulate the "bulb" portion when screwing the lamp into a threaded light socket. As depicted in the circular enlargement view V', each fin has a plastic or other lightweight planar fin body 354 providing structural support, and is coated on either side by the composite multilayer structure 202, 204, 206.

In any of the embodiments in which a thin planar fin support is coated on both sides by the composite multilayer structure 202, 204, 206 (e.g., as depicted in FIGS. 18, 22, 23), it is also contemplated for the composite multilayer structure 202, 204, 206 to also coat the "edge", that is, the thin surface connecting the opposing main planar surfaces of the planar fin support. Alternatively, since this "edge" has low area and is shielded from the direct light path by the fin body in some embodiments, the "edge" may be left uncoated.

In the following, an example is given of determination of a suitable coating thickness for a composite heat sink including a highly specularly reflecting layer coated by a light transmissive protective layer. In this example, the heat sink body (e.g., heat sink fin body 200 in FIG. 18 or planar fin body 314 in FIG. 22 or planar fin body 354 in FIG. 23) is assumed to be a polymer, the layer layer 202 is assumed to be a copper (Cu) layer, the reflective layer 204 is assumed to be a silver (Ag) layer, and the light-transmissive protective layer 206 is assumed to be a silicon dioxide ($SiO_2$) layer. Also let $T_1$ denote the temperature at the Ag to $SiO_2$ interface. Let $T_2$ denote the ambient temperature (which is treated as a blackbody radiator in this model), and let $T_w$ denote the temperature of the $SiO_2$ layer at the air interface. To summarize, the heat sink composite structure includes a molded polymer spine 200, 314, 354 plated with the desired thickness of copper (Cu) or other conductive material 202 such as nickel (Ni), silver (Ag), or so forth. This first plated layer 202 is over coated with a thin layer of silver (Ag) 204 to provide high specular reflectance. The Ag layer 204 is then over coated with a transparent coating of silicon dioxide ($SiO_2$) 206. (Alternatively, another light transmissive protective layer such as a polymer coating that is transparent in the visible part of the electromagnetic spectrum structure can also be used as the layer 206. The illustrative calculations presented in this example are for $SiO_2$). The effective rate of heat transfer from this multilayer heat sink surface 202, 204, 206 is dependent on the thickness of the light transmissive protective layer 206 (e.g., the $SiO_2$ in the illustrative example). Under simplifying assumptions, the optimal thickness of the light transmissive protective layer 206 for any particular design can be calculated as shown by the illustrative example now presented.

For a semi infinite plate (that is, the plate is taken to be of infinite length in the vertical dimension) in ambient air, the following assumptions can be made. First, the ambient acts as a black body radiator at temperature $T_2$. Second, the primary mechanism for heat loss to the ambient is convection and radiation. The temperature at the Ag to $SiO_2$ interface can at steady state be maintained at a fixed temperature $T_1$ by providing heat to the composite structure equivalent to the net total heat lost to the ambient through the outer surface of the $SiO_2$ layer ($SiO_2$-Air interface) calculated to keep the Ag—$SiO_2$ interface at temperature $T_1$. In the regime that the $SiO_2$ layer is optically thin with respect to infrared radiation, the heat loss through the $SiO_2$-Air interface can be summarized as follows:

$$Q=Q_{Conv}+Q_{Rad} \quad (1),$$

where Q is the net heat loss to ambient, $Q_{Conv}$ is the heat convection from $SiO_2$-Air interface to ambient, and $Q_{Rad}$ is the sum of the and the net radiation to ambient at the $SiO_2$-Air interface. Furthermore, in the optically thin region of $SiO_2$ $Q_{Rad}$ can be subdivided as:

$$Q_{Rad}=Q_{Rad\text{-}SiO2}+Q_{Rad\text{-}Ag\text{-}out} \quad (2),$$

where $Q_{Rad\text{-}SiO2}$ is the radiation generated within the $SiO_2$ layer via absorption and reemission, and $Q_{Rad\ Ag\_out}$ is the fraction of net radiation from the Ag—$SiO_2$ interface that passes through the $SiO_2$ layer without being absorbed. The following relationship follows from Kirchhoff's law:

$$Q_{Rad\text{-}SiO2}=Q_{Abs\text{-}SiO2} \quad (3),$$

where $Q_{Abs\text{-}SiO2}$ is the radiation absorbed by the $SiO_2$ layer. On the other hand, in the limit of an absorbing non-reflective system in the infrared wavelengths of interest, the following holds:

$$Q_{Rad\text{-}Ag\text{-}Out}=Q_{Trans\text{-}SiO2} \quad (4),$$

where $Q_{Trans\text{-}SiO2}$ is the radiation transmitted through the SiO2 layer. In the infrared wavelength region of interest, the $SiO_2$ layer transmittance changes as the thickness is increased and the layer becomes translucent and eventually opaque at higher thicknesses. The functional relationship of $Q_{Trans\text{-}SiO2}$ to the $SiO_2$ thickness and absorption coefficient of $SiO_2$ can be written in terms of the Beer-Lambert law for transmittance through an absorbing media where:

$$T_{SiO2}=e^{-at} \quad (5),$$

$$A_{SiO2}=1-e^{-at} \quad (6),$$

where in these equations $T_{SiO2}$ is the transmittance of the $SiO_2$ layer, $A_{SiO2}$ is the absorptance of the $SiO_2$ layer, t is the thickness of the $SiO_2$ layer, and $\alpha$ is the blackbody averaged absorption coefficient of the $SiO_2$ layer. Using the Planck's radiation function:

$$\alpha_{\lambda1-\lambda2}=\frac{\int_{\lambda1}^{\lambda2}\alpha_\lambda\frac{C_1\lambda^{-5}}{e^{\frac{C_2}{\lambda T}}-1}d\lambda}{\int_{\lambda1}^{\lambda2}\frac{C_1\lambda^{-5}}{e^{\frac{C_2}{\lambda T}}-1}d\lambda}, \quad (7)$$

where:

$$Q_{Cond\text{-}SiO2}=\frac{K_{SiO2}(T_1-T_w)}{t}, \quad (13)$$

and where $C_1=3.742\times10^8$ W-$\mu m^4/m^2$, $C_2=1.4387\times10^4$ $\mu$m-K, T is the temperature in units of Kelvin (K), k is the extinction coefficient (that is, the imaginary part of refractive index) of $SiO_2$ as a function of wavelength, and $\lambda$ is the wavelength of radiation of interest. A further relationship can be written as:

$$Q_{Rad\text{-}Ag\text{-}Out}=Q_{Trans\text{-}SiO2}Q_{Rad\text{-}Ag}{}^*T_{SiO2} \quad (9),$$

where $Q_{Rad\_Ag}$ (per unit area) is the calculated radiated heat from a silver (Ag) gray body at the Ag—$SiO_2$ interface temperature, and can be written as:

$$Q_{Rad\text{-}Ag}=\epsilon_{Ag}\,\sigma(T_1^4-T_2^4) \quad (10),$$

where $\epsilon_{Ag}$ is the emissivity of silver and $\sigma$ is the Stefan Boltzmann constant=$5.67\times10^{-8}$ W/($m^2$-$K^4$). Furthermore:

$$Q_{Rad\text{-}SiO2}=\epsilon_{SiO2}\,\sigma(T_w^4-T_2^4)=(1-e^{-at})\sigma(T_w^4-T_2^4) \quad (11),$$

where $T_w$ is the temperature of the $SiO_2$ layer at the air interface. In the optically thin region of $SiO_2$ it can also be assumed that radiation is independent of convection and conduction such that:

$$Q_{Cond\text{-}SiO2}=Q_{Conv} \quad (12),$$

where $Q_{Conv}$ is the heat convection from $SiO_2$-Air interface to ambient and $Q_{Cond\text{-}SiO2}$ is the heat conducted through the $SiO_2$ layer. Further:

$$\alpha_\lambda=\frac{4\pi k}{\lambda}, \quad (8)$$

and $$Q_{Conv}=h_{SiO2\text{-}air}(T_1-T_w) \quad (14),$$

where $K_{SiO2}$ is thermal conductivity of the $SiO_2$ layer and $h_{SiO2\text{-}air}$ is the convective heat transfer coefficient at the $SiO_2$-Air interface. Equations 13 and 14 can be used with appropriate physical data to calculate $T_w$ (that is, the temperature of the $SiO_2$ layer at the air interface), from which Equations (1)-(12) can be resolved.

A quantitative example of the foregoing for a $SiO_2$ light transmissive protective layer on a silver specularly reflective layer follows. The quantitative example uses extinction coefficient values provided in the Palik, Handbook of Optical Constants, from which the absorption coefficient of $SiO_2$ is calculated to be 0.64 in the relevant 3.5 micron to 27 micron infrared spectrum range. Values used in the quantitative examples are listed in Table A-1.

TABLE A-1

| | | | |
|---|---|---|---|
| Ag Temp | T1 | 100 | C. |
| Room Temp | T2 | 25 | C. |
| Stefan Boltzman Constant | Sigma | 5.67E−08 | Wm-2K-4 |
| Thermal conductivity of Silica Glassy | k | 0.9 | Wm-1K-1 |
| Emissivity of Ag | Eps1 | 0.02 | |
| Convective HTC | h | 5 | W/(m2-K) |

Figure 24:
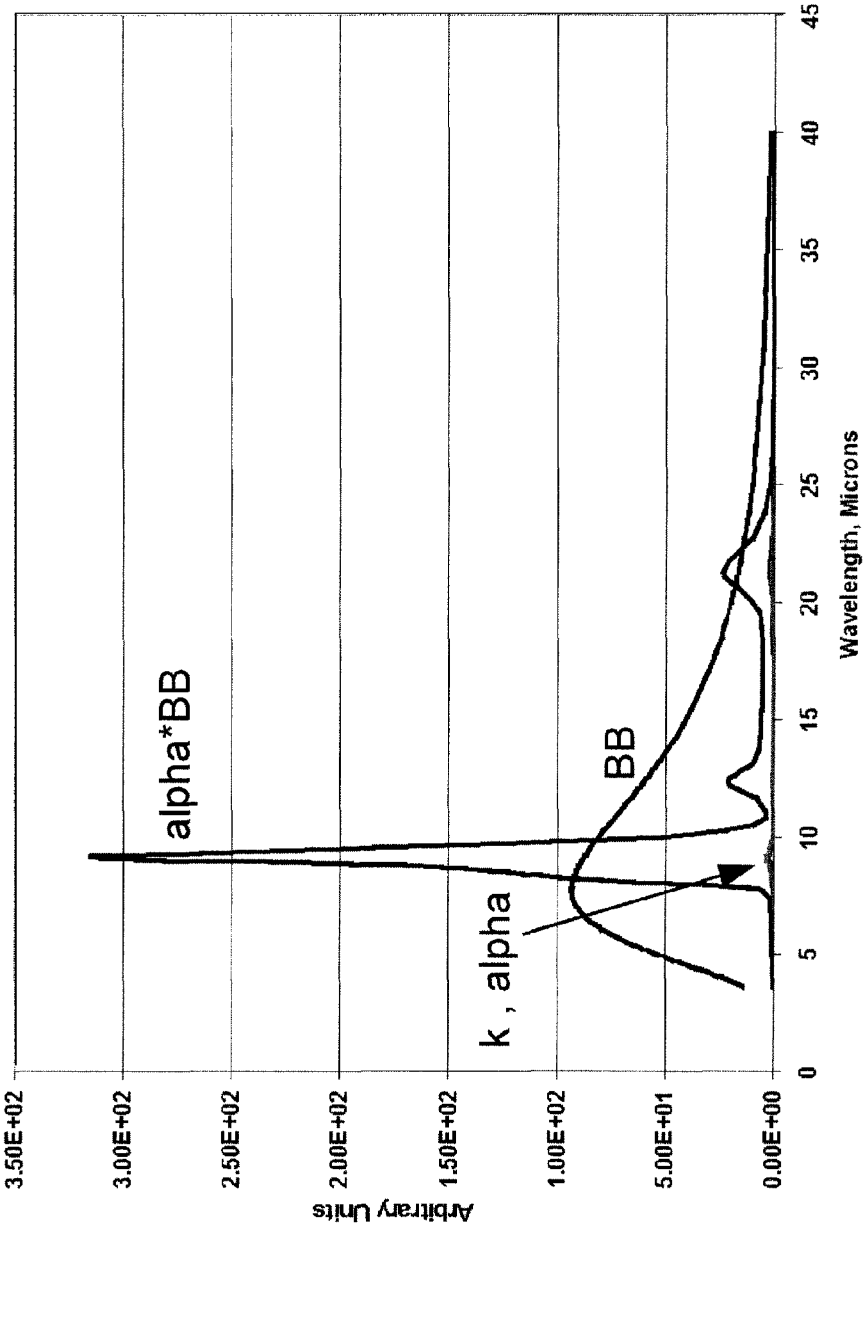
FIG. 24 plots various optical parameters, and FIGS. 25 and 26 plot Total heat flux vs SiO2 thickness at different scales, for an example described in the text.

FIG. 24 shows spectra of optical properties for the $SiO_2$ used in the quantitative example. The acronym "HTC" stands for "Heat Transfer Coefficient". The silver temperature of 100° C. is selected as corresponding to a typical desired operating temperature of an high-power light emitting diode (LED) device, and assumes efficient heat transfer to the silver such that the silver temperature is comparable with the LED operating temperature. FIG. 24 plots the $SiO_2$ extinction coefficient (k), absorption (alpha or $\alpha$), black body emittance (BB) at 100° C., and integrated absorption coefficient (alpha*BB). Notice that the $SiO_2$ has substantial absorption peaks and overall BB radiation in the infrared in spite of being optically transparent (or nearly optically transparent) in the visible spectrum.

Figure 25:
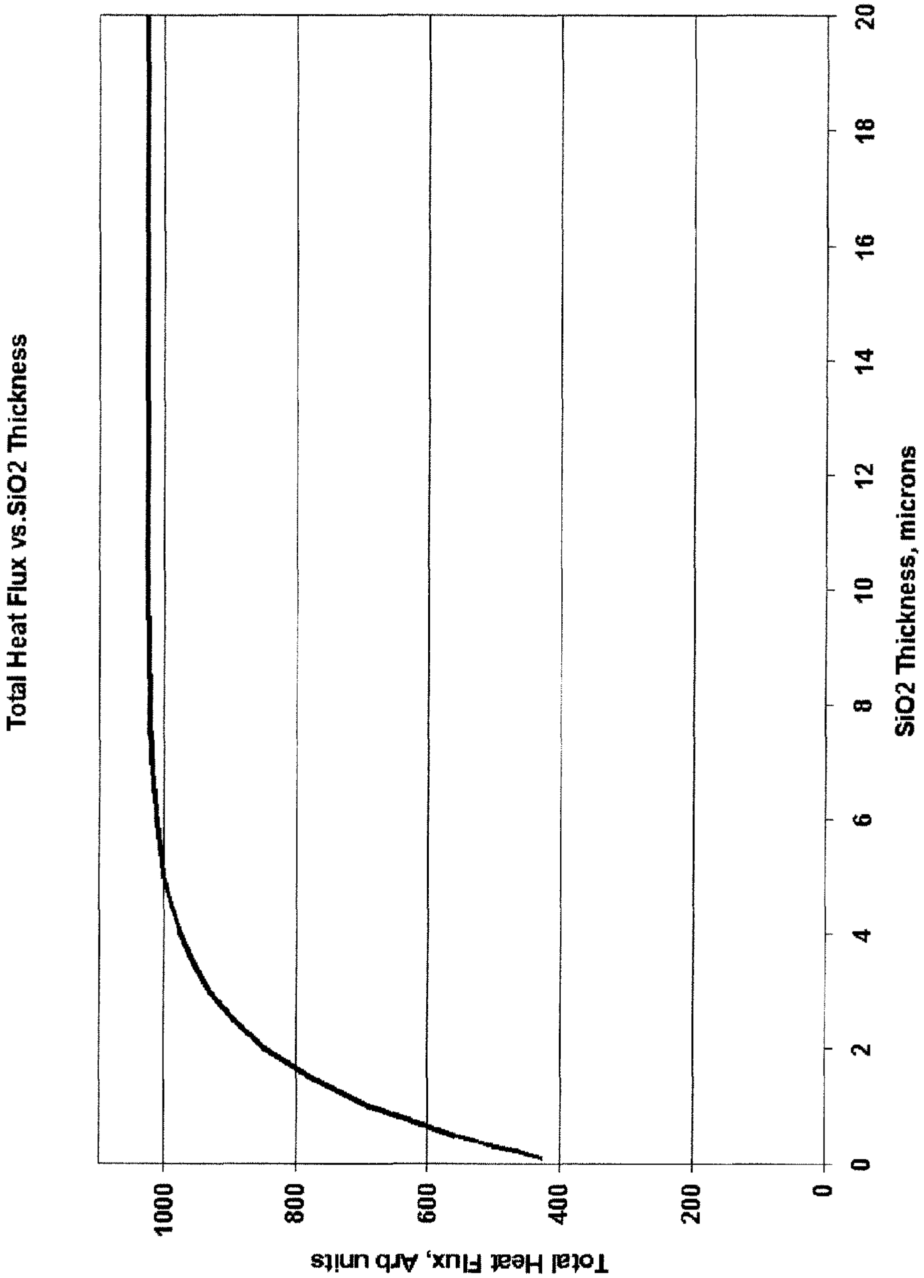
Figure 26:
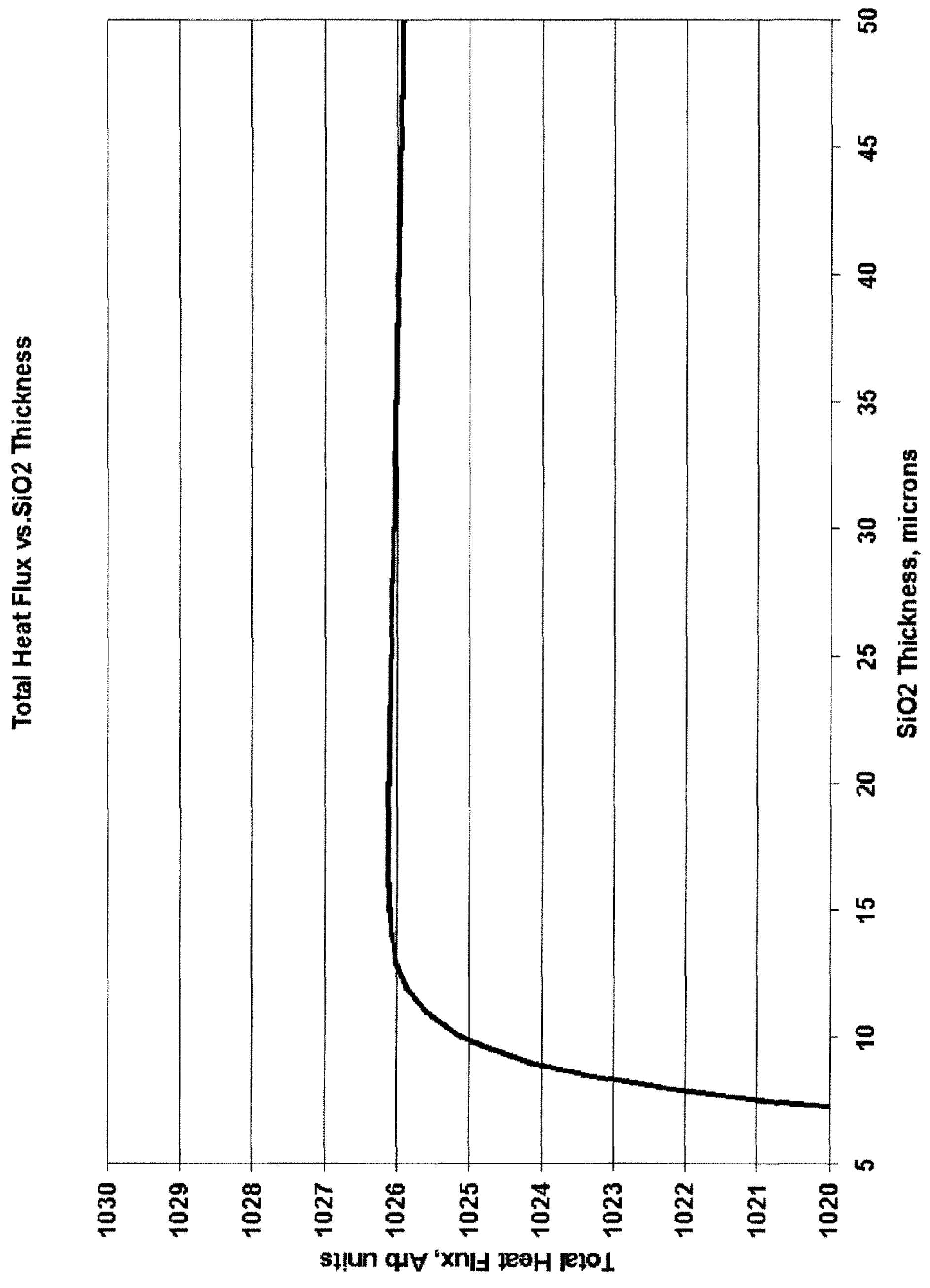

With reference to FIGS. 25 and 26, for the configuration of Table A-1, the Total flux vs. $SiO_2$ layer thickness curve is shown at different scales in respective FIG. 25 and FIG. 26. The $SiO_2$ is more efficient at radiating heat than the silver. However, the $SiO_2$ can only radiate heat that it receives, for example by infrared absorption. This explains the increase in total heat flux with increasing $SiO_2$ thickness up to about 5-15 microns. For $SiO_2$ thickness above that range, the total heat flux begins to slowly decrease, as the $SiO_2$ is now opaque for the infrared radiation and the additional thickness does not contribute to infrared aborption. These results indicate that a suitable thickness for $SiO_2$ on silver for efficient total thermal loss is approximately 5 to 15 microns, beyond which additional $SiO_2$ thickness starts decreasing the net heat removal. This occurs because above about 5-15 microns the $SiO_2$ layer becomes opaque to the infrared radiation, and any additional $SiO_2$ thickness does not contribute to the absorbed infrared heat that can be radiated out by emittance of the $SiO_2$ layer.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A heat sink comprising:

a heat sink body;

a reflective layer disposed over the heat sink body that has reflectivity greater than 90% for light in the visible spectrum; and a light transmissive protective layer disposed over the reflective layer that is light transmissive for light in the visible spectrum.

2. The heat sink of claim 1, wherein the reflective layer comprises a specularly reflective layer.

3. The heat sink of claim 1, wherein the multilayer structure including the reflective layer and the light transmissive protective layer comprises a specular reflector having less than 10% light scattering.

4. The heat sink of claim 1, wherein the multilayer structure including the reflective layer and the light transmissive protective layer comprises a specular reflector having less than 5% light scattering.

5. The heat sink of claim 1, wherein the heat sink body comprises:

a structural heat sink body; and a thermally conductive layer disposed over the structural heat sink body, the thermally conductive layer having higher thermal conductivity than the structural heat sink body, the reflective layer being disposed over the thermally conductive layer.

6. The heat sink of claim 5, wherein the thermally conductive layer has a thickness of 500 micron or less and a thermal conductivity of 50 W/m·K or higher.

7. The heat sink of claim 5, wherein the thermally conductive layer has a thickness of at least 150 micron and a thermal conductivity of 500 W/m·K or higher.

8. The heat sink of claim 5, wherein the structural heat sink body comprises a plastic or polymeric structural heat sink body.

9. The heat sink of claim 5, wherein the thermally conductive layer comprises a copper (Cu) layer.

10. The heat sink of claim 1, wherein the light transmissive protective layer is light absorbing for infrared light and is optically thick for infrared light.

11. The heat sink of claim 1, wherein the light transmissive protective layer has a thickness greater than or equal to 1 micron.

12. The heat sink of claim 1, wherein the light transmissive protective layer has a thickness greater than or equal to 5 microns.

13. The heat sink of claim 1, wherein the light transmissive protective layer has a thickness greater than or equal to 10 microns.

14. The heat sink of claim 1, wherein the light transmissive protective layer has a thickness of no more than 15 microns.

15. The heat sink of claim 1, wherein the light transmissive protective layer comprises a silicon dioxide ($SiO_2$) or silica layer.

16. The heat sink of claim 1, wherein the light transmissive protective layer comprises a light transmissive plastic, polymer, glass, or ceramic layer.

17. The heat sink of claim 1, wherein the reflective layer comprises a silver (Ag) layer.

18. The heat sink of claim 1, wherein the reflective layer is of sufficient thickness that incident light is reflected without an evanescent wave passing through the specularly reflective layer.

19. The heat sink of claim 1, wherein the heat sink body includes heat radiating surface area enhancing structures and the reflective layer and the light transmissive protective layer are disposed over at least the heat radiating surface area enhancing structures.

20. The heat sink of claim 19, wherein the heat radiating surface area enhancing structures comprise heat radiating fins.

21. The heat sink of claim 1, wherein the heat sink defines a hollow light collecting reflector and the reflective layer and the light transmissive protective layer are disposed over at least an inner surface of the hollow light collecting reflector.

22. The heat sink of claim 21, wherein the heat sink includes inwardly extending fins disposed inside the hollow light collecting reflector and the reflective layer and the light transmissive protective layer are additionally disposed over at least the inwardly extending fins.

23. A light emitting diode (LED)-based lamp comprising:

a heat sink including a heat sink body, a reflective layer disposed over the heat sink body that has reflectivity greater than 90% for light in the visible spectrum, and a light transmissive protective layer disposed over the reflective layer that is light transmissive for light in the visible spectrum; and an LED module secured with and in thermal communication with the heat sink.

24. The LED-based lamp of claim 23, wherein:

the LED-based lamp has an A-line bulb configuration and further includes a diffuser illuminated by the LED module; and the heat sink includes fins disposed inside or outside the diffuser and the reflective layer and the light transmissive protective layer are disposed over at least the fins.

25. The LED-based lamp of claim 24, wherein the diffuser is hollow and the heat sink includes tins disposed inside the hollow diffuser.

26. The LED-based lamp of claim 23, wherein the LED-based lamp comprises a directional lamp, the heat sink defines a hollow light-collecting reflector, and the reflective layer and the light transmissive protective layer are disposed over at least an inner surface of the hollow light collecting reflector.

27. The LED-based lamp of claim 26, wherein the heat sink includes inwardly extending fins disposed inside the hollow light collecting reflector and the reflective layer and the light transmissive protective layer are additionally disposed over at least the inwardly extending fins.

28. The LED-based lamp of claim 23, wherein the heat sink comprises a reflective optical component of the LED-based lamp.

* * * * *